US006982942B2

(12) United States Patent
Uchida et al.

(10) Patent No.: US 6,982,942 B2
(45) Date of Patent: Jan. 3, 2006

(54) DATA RECORDING AND/OR REPRODUCING APPARATUS FOR DEMODULATING DATA FROM A REPRODUCTION SIGNAL

(75) Inventors: Akiyoshi Uchida, Kawasaki (JP); Masakazu Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 437 days.

(21) Appl. No.: 10/096,280

(22) Filed: Mar. 12, 2002

(65) Prior Publication Data

US 2003/0072242 A1   Apr. 17, 2003

(30) Foreign Application Priority Data

Oct. 15, 2001 (JP) .............................. 2001-317039

(51) Int. Cl.
*G11B 7/005* (2006.01)
(52) U.S. Cl. .................. 369/59.22; 714/800; 714/796; 714/794; 369/30.21
(58) Field of Classification Search ............. 369/59.22, 369/30.21; 714/800, 801, 802, 803, 792, 714/794, 795, 796, 6, 52
See application file for complete search history.

(56) References Cited

U.S. PATENT DOCUMENTS

| 5,220,568 | A | * | 6/1993 | Howe et al. ................ 714/782 |
| 5,961,658 | A | * | 10/1999 | Reed et al. ................ 714/746 |
| 5,978,958 | A | * | 11/1999 | Tanaka et al. ............. 714/804 |
| 6,434,719 | B1 | * | 8/2002 | Livingston ................. 714/804 |
| 6,543,023 | B2 | * | 4/2003 | Bessios ..................... 714/758 |
| 6,654,924 | B1 | * | 11/2003 | Hassner et al. ............ 714/758 |

FOREIGN PATENT DOCUMENTS

| JP | 63-120527 | 5/1988 |
| JP | 10-302408 | 11/1998 |
| JP | 2000-20332 | 1/2000 |

* cited by examiner

*Primary Examiner*—Brian E. Miller
*Assistant Examiner*—Michael V. Battaglia
(74) *Attorney, Agent, or Firm*—Greer, Burns & Crain, Ltd.

(57) ABSTRACT

In a data recording apparatus, values of parity bits to be additionally provided every one predetermined length block in data obtained by demodulating the original data are determined so as to satisfy a part of or an entire the predetermined run length limitation rule in ranges of a current predetermined length block, the plurality of parity bits, and a next predetermined length block that is positioned next to the current block. The parity bits having the values are additionally provided to the current block.

9 Claims, 12 Drawing Sheets

FIG. 7

| PR(110)ML+d | | | STATE TRANSITION | | EXPECTED VALUE |
|---|---|---|---|---|---|
| STATE(t, t+1) | | | S0→S0 | 000 | 0 |
| | | | S1→S0 | 100 | 1 |
| S0 | 0 | 0 | ~~S2→S1~~ | ~~010~~ | ~~1~~ |
| S1 | 1 | 0 | S3→S1 | 110 | 2 |
| S2 | 0 | 1 | S0→S2 | 001 | 0 |
| S3 | 1 | 1 | ~~S1→S2~~ | ~~101~~ | ~~1~~ |
| | | | S2→S3 | 011 | 1 |
| | | | S3→S3 | 111 | 2 |

TRAILING EDGE

LEADING EDGE

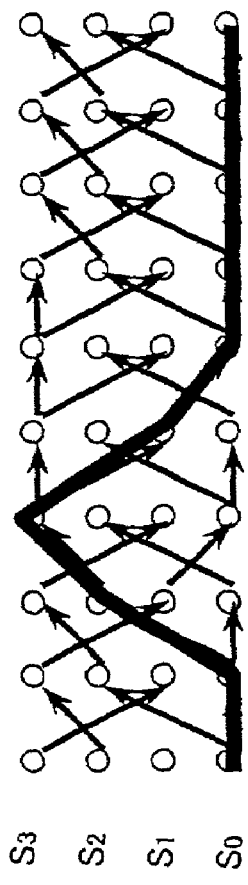
FIG. 9A SELECTION PATH OF FRONT EDGE SYSTEM → $X_{1L}$:000110000
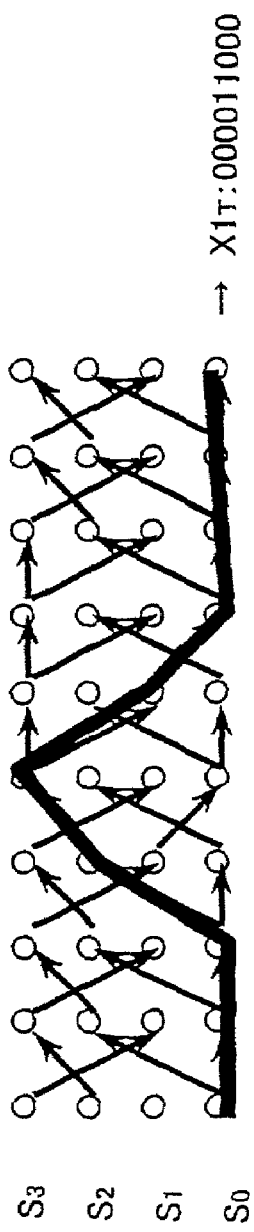
FIG. 9B SELECTION PATH OF BACK EDGE SYSTEM → $X_{1T}$:000011000
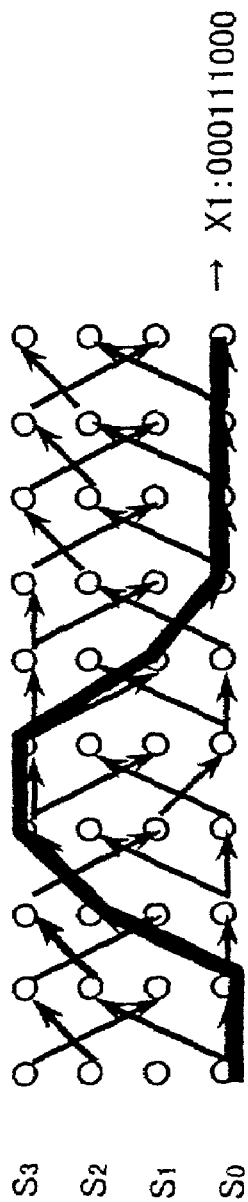
FIG. 9C MIXED SELECTION PATH → $X_1$:000111000

DATA RECORDING AND/OR REPRODUCING APPARATUS FOR DEMODULATING DATA FROM A REPRODUCTION SIGNAL

BACKGROUND OF THE INVENTION

1. Field of the Invention

The present invention generally relates to a data recording apparatus, and more particularly to the data recording apparatus in which original data is modulated in accordance with a predetermined run length limitation rule and data obtained by modulating the original data is written on a recording medium.

Moreover, the present invention generally relates to a data reproducing apparatus, and more particularly to the data reproducing apparatus in which data is reproduced by using a Viterbi decoding algorithm from a reproduction signal that is based on a partial-response waveform obtained from the recording medium.

Furthermore, the present invention generally relates to a data recording/reproducing apparatus including each function of the data recording apparatus described above and the data reproducing apparatus.

2. Description of the Related Art

A magneto-optical disc as an example of the data recording/reproducing apparatus has been widely used in various fields to record or reproduce image information or to record or reproduce various coded data for a computer because of a large capacity, a lower price, a high reliability, and a like. As for the magneto-optical disc, it is desired to improve much larger capacity of storage, to record data at higher density, and to reproduce the data with high precision.

As a technology of recording and reproducing data with high precision, for example, one technology is proposed in that a record signal obtained by modulating data to be recorded to the partial-response waveform is recorded on the magneto-optical disc, and a most likelihood (ML) data is detected by a most likelihood data detector (for example, Viterbi detector) after sampling a reproduction signal from the magneto-optical disc at a predetermined period.

For example, the Viterbi detector is configured as shown in FIG. 1.

Referring to FIG. 1, the Viterbi detector includes a branch metric calculating unit (hereinafter, simply called BM) 101, an Add-Compare-Select unit (hereinafter, simply called ACS) 102, a path metric memory (hereinafter, simply called PMM) 103, and a path memory (hereinafter, simply called PM) 104.

In the Viterbi detector applied to a data read system of the magneto-optical-disc device, a sampling value yt of the reproduction signal from a magneto-optical disc is supplied to the BM 101, and the BM 101 calculates a branch metric value (hereinafter, simply called BM value) that is a difference of the sampling value yt and an expected value. The expected value is a value depending on the partial-response waveform used when data is recorded and is a value which the reproduction signal can originally be. The BM value is calculated for every expected value when one sampling value yt is supplied to the BM 101.

The ACS 102 adds the BM value mentioned above and a path metric value (hereinafter, simply called PM value) stored in the PMM 103 one clock before (Add), and compares every two PM values after the addition (Compare). Subsequently, as a result of the comparison described above, the ACS 102 selects the PM value being smaller as a new PM value (Select), and stores the selected PM value in the PMM 103. As a result of such this process, the PM value is a summation of the BM values. Selecting a certain PM value is equivalent to selecting a path of a state transition. That is, the ACS 102 always selects the path of the state transition with where the PM value becomes a minimum value.

Data (binary data) corresponding to the path selected are supplied to the PM 104 from the ACS 102. The PM 104 sequentially shifts data corresponding to each path selected. In this process, the data, which correspond to each path and are considered not to have been selected based on the succession of the state transition, are continuously eliminated. Consecutively, the PM 104 outputs the data corresponding to a surviving path as detected data.

As described above, record data is modulated to the record signal in accordance with the partial-response waveform, and the record signal is recorded on the magneto-optical disc. On the other hand, data, which are recorded on the magneto-optical disc at high density, are reproduced with high precision from the magneto-optical disc. Such a record/reproduction technique is called the technique of a partial response and most-likelihood detection (hereinafter, simply called PRML).

However, in the data recording/reproducing apparatus using the magneto-optical disc of the ISO (International Organization for Standardization) standard, a clock signal for synchronization is generated according to a so-called self-clocking technique. In the self-clocking technique, the clock signal is generated so as to actually synchronize with changes of the reproduction signal read from the magneto-optical disc. Accordingly, in order to avoid a state in that the reproduction signal has not changed for a long time, data to be recorded (hereinafter, called original data) are modulated in accordance with a predetermined run length limitation rule (for example, (1,7)RLL (Run Length Limitation) and data to be actually written on the magneto-optical disc are generated. Therefore, in the data to be actually written on the magneto-optical disc, a bit of the same value ("0" or "1") does not continue more than a predetermined number.

When the record data is reproduced by the Viterbi detection based on the reproduction signal read from the magneto-optical disc recording data obtained by modulating the original data in accordance with the predetermined run length limitation rule, it is not required to consider any state transition that can not exist based on the predetermined run length limitation rule. Based on a limitation of possible state transitions (for example, called D-limitation), it is possible to simplify a process of the ACS 102.

In general, It is possible to include one or a plurality of parity bits for every predetermined bit number in the data written in the magneto-optical disc. In this case, the data is reproduced from the reproduction signal read from the magneto-optical disc, and the parity bits are checked for every predetermined bit number in the reproduction data. Thus, it is possible to check whether or not the reproduction data has an error.

In a case in which the original data is modulated in accordance with the predetermined run length limitation rule and data to be actually written in the magneto-optical disc are generated, there is a problem of how to insert the parity bits into the data.

For example, if data obtained as the record data by adding parity bits to the original data is modulated in accordance with the run length limitation rule in the read system, those parity bits do not become effective until the record data is reproduced by a demodulation corresponding to the modulation in accordance with the run length limitation rule.

Thus, in a reproduction process by the Viterbi detection before the modulation described above, the parity bits cannot be used effectively.

Moreover, if the parity bits are added to the data obtained by modulating the original data in accordance with the predetermined run length limitation rule, the run length limitation rule is not followed for the data as a whole.

Thus, when the original data are modulated in accordance with the run length limitation rule and data to be written are generated, arrangements for how to add the parity bits are needed.

Furthermore, in order to relieve the edge shift by light modulation record, a data reproducing apparatus is proposed in that final data is obtained by synthesizing data reproduced in accordance with the ML technique from the sampling value obtained synchronizing with a leading edge (front edge) of the reproduction signal and data reproduced in accordance with the ML technique from the sampling value obtained synchronizing with the trailing edge (back edge) of the reproduction signal. This data reproducing apparatus requires two systems (a front edge processing system and a back edge processing system) for reproducing data from the reproduction signal. Therefore, it is desired to simplify the circuit configuration of the data reproducing apparatus as much as possible.

SUMMARY OF THE INVENTION

It is a general object of the present invention to provide a data recording apparatus, a data reproducing apparatus, and a data recording/reproducing apparatus in which the above-mentioned problems are eliminated.

A first specific object of the present invention is to provide a data recording apparatus in which data is recorded so that both a run length limitation and parity bits are available when data is reproduced.

Moreover, a second specific object of the present invention is to provide a data reproducing apparatus that can simplify a configuration thereof and also can improve data detection ability and a noise resistance characteristic.

Furthermore, a third specific object of the present invention is to provide a data recording/reproducing apparatus including each function of such a data recording apparatus and a data reproducing apparatus described above.

The above first object of the present invention is achieved by a data recording apparatus for writing data to a recording medium, the data obtained by modulating original data in accordance with a predetermined run length limitation rule, the data recording apparatus including: a parity bit determining part determining values of parity bits to be additionally provided every one predetermined length block in data obtained by demodulating the original data, so as to satisfy a part of or the entire predetermined run length limitation rule in ranges of a current predetermined length block in which the plurality of parity bits are additionally provided, the plurality of parity bits, and a next predetermined length block that is positioned next to the current block; and a parity adding part adding the parity bits having the values determined by the parity bit determining part to the current block, wherein data, in which the parity bits are provided to every one predetermined length block, are written in the recording medium.

According to the present invention, in the data recording apparatus, the parity bits are additionally provided every predetermined length block of data demodulated in accordance with the predetermined run length limitation rule. And the predetermined run length limitation rule is partially or entirely satisfied in the range including the parity bits and the entire current predetermined length block and the next predetermined length block positioned before and after the parity bits.

The parity bit determining part may determine the values of the parity bits so as to satisfy a predetermined run length limitation in a first range including both a predetermined last range of the current predetermined length block defined based on the predetermined run length limitation rule and a range of a plurality of parity bits following the predetermined last range, and further satisfy a part of or the entire predetermined run length limitation in a second range including the first range and a predetermined first range defined based on the predetermined run length limitation rule.

In addition, in a view point in that data can be properly reproduced from the recording medium in which data is recorded by the data recording apparatus, according to the present invention, a data reproducing apparatus for reproducing data recorded on a recording medium based on a reproduction signal read from the recording medium, includes a sampling part obtaining a sampling value at a predetermined period from the reproduction signal; a data detecting part detecting a data bit sequence in accordance with a predetermined algorithm from the sampling value obtained by the sampling part; a parity check part conducting a parity check for every predetermined length block in the data bit sequence detected by the data detecting part; a parity deleting part deleting the parity bits added in accordance with a predetermined rule from each of the predetermined length blocks that is justified by the parity check part; and a data demodulating part demodulating a remaining bit sequence, in which the parity bits are deleted from each of the predetermined length blocks by the parity deleting part, in accordance with a demodulation rule corresponding to the predetermined run length limitation rule, so as to demodulate data.

Moreover, the above second object of the present invention is achieved by a data reproducing apparatus for demodulating data from a reproduction signal in accordance with a partial response waveform obtained from a recording medium, by a Viterbi decoding technique based on front edge sampling values obtained by sampling while synchronizing a front edge clock synchronizing a leading edge of the reproduction signal and back edge sampling values obtained by sampling while synchronizing a back edge clock synchronizing a trailing edge of the reproduction signal, including: a front edge system processing the front edge sampling values; a back edge system processing the back edge sampling values; and a processing system modulating data based on information obtained individually from the front edge system and the back edge system, wherein: the front edge system includes: a first selection path selecting part selecting one path as a first selection path so as to correspond to a state transition of data according to a predetermined rule that is based on results from calculating a branch metric value using each expected value defined by the partial response waveform and each of the front edge sampling values, calculating a path metric value based on every the branch metric value, and comparing among a plurality of the path metric values; a first generating part generating front edge candidate data corresponding to the first selection path selected by the first selection path selecting part; and a first change path selecting part selecting one path different from the first selection path as a first change path based on differences among the plurality of the path metric values to be compared by the first selection path selecting part, the back edge system includes: a second selection path selecting part selecting one path as a second selection path so as to correspond to the state transition of data according to the predetermined rule that is based on results from calculating a branch metric value using each expected value defined by the partial response waveform and each of the back edge sampling values, calculating a path metric value based on every the branch metric value, and comparing among a plurality of the branch metric values; a second generating selecting part generating back edge candidate data corresponding to the second selection path selected by the second selection path selecting part; and a second change path selecting part selecting one path different from the second selection path as a second change path based on differences among the plurality of the path metric values to be compared by the second selection path selecting part, the processing system includes: first candidate data generating part generating first candidate data by synthesizing the front edge candidate data from the front edge system with the back edge candidate data from the back edge system, a mixed selection path generating part generating a mixed selection path based on the first selection path from the front edge system and the second selection path from the back edge system; second candidate data generating part changing paths that are of the mixed selection path and correspond to the first change path from the front edge system and the second change path from the back edge system, to the change paths as change selection paths, and generating second candidate data in accordance with the Viterbi decoding technique based on the change selection paths; and a data selecting part selecting either of the first candidate data and the second candidate data based on a predetermined reference concerning likelihood, wherein data to be reproduced are reproduced based on either of the first candidate data and the second candidate data selected by the data selecting part.

The greater the differences of the path metric values compared when selecting one path, the more reliable. On the other hand, the smaller the difference (that is, the path metric values to be compared are closer each other), the less reliable. In the data reproducing apparatus, both a path selected in accordance with the predetermined rule and the change path selected based on the differences of the path metric values showing a reliable ratio of the path selected are considered and then data are determined.

Moreover, in each of the front edge system and the back edge system, in accordance with the Viterbi decoding technique, the branch metric value is calculated, the path metric value is calculated, the selection path is generated, the front edge candidate data (the back edge candidate data) are generated, and the change path is selected. The processing system determines final data by using the selection path, the front-back edge candidate data, and the change path.

The data selecting part may be configured so that either of the first candidate data and the second candidate data may be selected as a predetermined reference of likelihood using the reference based on the technique of predetermined error detection.

The technique of the predetermined error detection is not limited. For example, The technique may be a technique of an ECC (Error Correcting Code) or a technique of parity check.

From a viewpoint of preventing causing accuracy deterioration by data generated based on the path selected in accordance with a predetermined rule, when the data selecting part may be configured so as to select the first candidate data whenever the error detection is conducted with respect to the first candidate data or the second candidate data.

Moreover, when a plurality of the first change paths and a plurality of the second change paths are supplied from the front edge system and back edge system, respectively, the second candidate data generating part may generate a plurality of the change selection paths by using every one or given number of the plurality of the first change paths and the plurality of the second change paths, and may generate a plurality of the second candidate data corresponding the plurality of the change selection paths, and the data selecting part may select data from the first candidate data and the plurality of the second candidate data.

Alternatively, from a viewpoint of simplifying a configuration, a data reproducing apparatus for demodulating data from a reproduction signal in accordance with a partial response waveform obtained from a recording medium, by a Viterbi decoding technique based on front edge sampling values obtained by sampling while synchronizing a front edge clock synchronizing a leading edge of the reproduction signal and back edge sampling values obtained by sampling while synchronizing a back edge clock synchronizing a trailing edge of the reproduction signal, the data reproducing apparatus including: a front edge system processing the front edge sampling values; and a back edge system processing the back edge sampling values, wherein: the front edge system includes: a first selection path generating part generating a first selection path by selecting one path so as to correspond to a state transition of data according to a predetermined rule that is based on results from calculating a branch metric value using each expected value defined by the partial response waveform and each of the front edge sampling values, calculating a path metric value based on every the branch metric value, and comparing among a plurality of the path metric values, the back edge system: a second selection path generating part generating a second selection path by selecting one path so as to correspond to the state transition of data according to the predetermined rule that is based on results from calculating a branch metric value using each expected value defined by the partial response waveform and each of the back edge sampling values, calculating a path metric value based on every the branch metric value, and comparing among a plurality of the branch metric values, and the processing system includes: a generating part generating a synthesized selection path by synthesizing every the first selection path from the front edge system and every the second selection path from the back edge system; a difference selecting part selecting a difference with respect to the path metric values corresponding to the synthesized selection paths from differences among the path metric values compared when the first selection path generating part selects the one path in the front edge system and the second selection path generating part selects the one path in the back edge system; a change path selecting part selecting one path as a change path different from a change path corresponding to the synthesized selection path based on the difference with respect to the path metric values; a first candidate data generating part generating first candidate data in accordance with the Viterbi decoding technique based on the synthesized selection path; a second candidate data generating part generating second candidate data in accordance with the Viterbi decoding technique based on a change selection path in which a path corresponding to the change path in a plurality of the synthesized selection paths is changed to the change path; and a data selecting part selecting either of the first candidate data and the second candidate data based on a predetermined reference concerning likelihood, wherein data to be reproduced are reproduced based on either of the first candidate data and the second candidate data selected by the data selecting part.

In the data reproducing apparatus, each of the front edge system and the back edge system is not required to provide the change path selecting part and the candidate data generating part. Therefore, it is possible to simplify the configuration of the data reproducing apparatus.

When a plurality of the change paths are selected by the change selecting part, the second candidate data generating part may generate a plurality of the change selection paths by using every one or given number of the change paths, and may generate a plurality of the second candidate data corresponding to the plurality of the change selection paths. The data selecting part may select either of the first candidate data and the second candidate data.

Furthermore, the above third object of the present invention is achieved by a data recording/reproducing apparatus including: a write unit for writing data obtained by modulating original data in accordance with a predetermined run length limitation to a recording medium; and a read unit for reproducing data from a reproduction signal in accordance with a partial response waveform obtained from the recording medium by a Viterbi decoding technique based on front edge sampling values obtained by sampling while synchronizing a front edge clock synchronizing a leading edge of the reproduction signal and back edge sampling values obtained by sampling while synchronizing a back edge clock synchronizing a trailing edge of the reproduction signal, wherein: the write unit includes: a parity bit determining part determining values of parity bits to be additionally provided every one predetermined length block in data obtained by demodulating the original data, so as to satisfy a part of or the entire predetermined run length limitation rule in ranges of a current predetermined length block in which the plurality of parity bits are additionally provided, the plurality of parity bits, and a next predetermined length blocks that is positioned next to the current block; and a parity adding part adding the parity bits having the values determined by the parity bit determining part to the current block, wherein data, in which the parity bits are provided every one predetermined length block, are written in the recording medium, the read unit includes: a front edge system processing the front edge sampling values; a back edge system processing the back edge sampling values; and a processing system modulating data based on information obtained individually from the front edge system and the back edge system, wherein: the front edge system includes: a first selection path selecting part selecting one path as a first selection path so as to correspond to a state transition of data according to a predetermined rule that is based on results from calculating a branch metric value using each expected value defined by the partial response waveform and each of the front edge sampling values, calculating a path metric value based on every the branch metric value, and comparing among a plurality of the path metric values; a first generating part generating front edge candidate data corresponding the first selection path selected by the first selection path selecting part; and a first change path selecting part selecting one path different from the first selection path as a first change path based on differences among the plurality of the path metric values to be compared by the first selection path selecting part, the back edge system includes: a second selection path selecting part selecting one path as a second selection path so as to correspond to the state transition of data according to the predetermined rule that is based on results from calculating a branch metric value using each expected value defined by the partial response waveform and each of the back edge sampling values, calculating a path metric value based on every the branch metric value, and comparing among a plurality of the branch metric values; a second generating selecting part generating back edge candidate data corresponding to the second selection path selected by the second selection path selecting part; and a second change path selecting part selecting one path different from the second selection path as a second change path based on differences among the plurality of the path metric values to be compared by the second selection path selecting part, and the processing system includes: a first candidate data generating part generating first candidate data by synthesizing the front edge candidate data from the front edge system with the back edge candidate data from the back edge system; a mixed selection path generating part generating a mixed selection path based on the first selection path from the front edge system and the second selection path from the back edge system; a second candidate data generating part changing paths that are of the mixed selection path and correspond to the first change path from the front edge system and the second change path from the back edge system, to the change paths as change selection paths, and generating second candidate data in accordance with the Viterbi decoding technique based on the change selection paths; a data selecting part selecting either of the first candidate data and the second candidate data based on error detection result in accordance with an addition rule of the parity bits with respect to the first candidate data and the second candidate data; a parity deleting part deleting parity bits additionally provided in accordance with the predetermined addition rule from the first candidate data and the second candidate data that are selected by the data selecting part; and a data demodulating part demodulating remaining data parts in which the parity bits are deleted from the first candidate data and the second candidate data that are selected by the data selecting part.

Alternatively, the above third object of the present invention is achieved by a data recording/reproducing apparatus including: a write unit for writing data obtained by modulating original data in accordance with a predetermined run length limitation to a recording medium; and a read unit for reproducing data from a reproduction signal in accordance with a partial response waveform obtained from the recording medium by a Viterbi decoding technique based on front edge sampling values obtained by sampling while synchronizing a front edge clock synchronizing a leading edge of the reproduction signal and back edge sampling values obtained by sampling while synchronizing a back edge clock synchronizing a trailing edge of the reproduction signal, wherein: the write unit includes: a parity bit determining part determining values of parity bits to be additionally provided every one predetermined length block in data obtained by demodulating the original data, so as to satisfy a part of or an entire the predetermined run length limitation rule in ranges of a current predetermined length block in which the plurality of parity bits are additionally provided, the plurality of parity bits, and a next predetermined length block that is positioned next to the current block; and a parity adding part adding the parity bits having the values determined by the parity bit determining part to the current block, wherein data, in which the parity bits are provided every one predetermined length block, are written in the recording medium, the read unit includes: a front edge system processing the front edge sampling values; and a back edge system processing the back edge sampling values, wherein: the front edge system includes: a first selection path generating part generating a first selection path by selecting one path so as to correspond to a state transition of data according to a predetermined rule that is based on results from calculating a branch metric value using each expected value defined by the partial response waveform and each of the front edge sampling values, calculating a path metric value based on every the branch metric value, and comparing among a plurality of the path metric values, the back edge system includes: a second selection path generating part generating a second selection path by selecting one path so as to correspond to the state transition of data according to the predetermined rule that is based on results from calculating a branch metric value using each expected value defined by the partial response waveform and each of the back edge sampling values, calculating a path metric value based on every the branch metric value, and comparing among a plurality of the branch metric values, and the processing system includes: a generating part generating a synthesized selection path by synthesizing every the first selection path from the front edge system and every the second selection path from the back edge system; a difference selecting part selecting a difference with respect to the path metric values corresponding to the synthesized selection paths from differences among the path metric values compared when the first selection path generating part selects the one path in the front edge system and the second selection path generating part selects the one path in the back edge system; a change path selecting part selecting one path as a change path different from a change path corresponding to the synthesized selection path based on the difference with respect to the path metric values; a first candidate data generating part generating first candidate data in accordance with the Viterbi decoding technique based on the synthesized selection path; a second candidate data generating part generating second candidate data in accordance with the Viterbi decoding technique based on a change selection path in which a path corresponding to the change path in a plurality of the synthesized selection paths is changed to the change path; a data selecting part selecting either of the first candidate data and the second candidate data based on error detection result in accordance with an addition rule of the parity bits with respect to the first candidate data and the second candidate data; a parity deleting part deleting parity bits additionally provided in accordance with the predetermined addition rule from the first candidate data and the second candidate data that are selected by the data selecting part; and a data modulating part modulating remaining data parts in which the parity bits are deleted from the first candidate data and the second candidate data by the parity deleting part.

BRIEF DESCRIPTION OF THE DRAWINGS

Other objects, features and advantages of the present invention will become more apparent from the following detailed description when read in conjunction with the accompanying drawings, in which:

FIG. 7 is a diagram showing a relationship between a state transition and a leading edge and a relationship between the state transition and a trailing edge;

FIG. 9A is a diagram showing relationships among a selection path, a final selection path, and candidate data in a front edge system, FIG. 9B is a diagram showing relationships among the selection path, the final selection path, and the candidate data in a back edge system, and FIG. 9C is a diagram showing relationships among the selection path, the final selection path, and the candidate data that are mixed with those of the front edge system and the back edge system;

DESCRIPTION OF THE PREFERRED EMBODIMENTS

An embodiment according to the present invention will be described with reference to figures.

Figure 2:
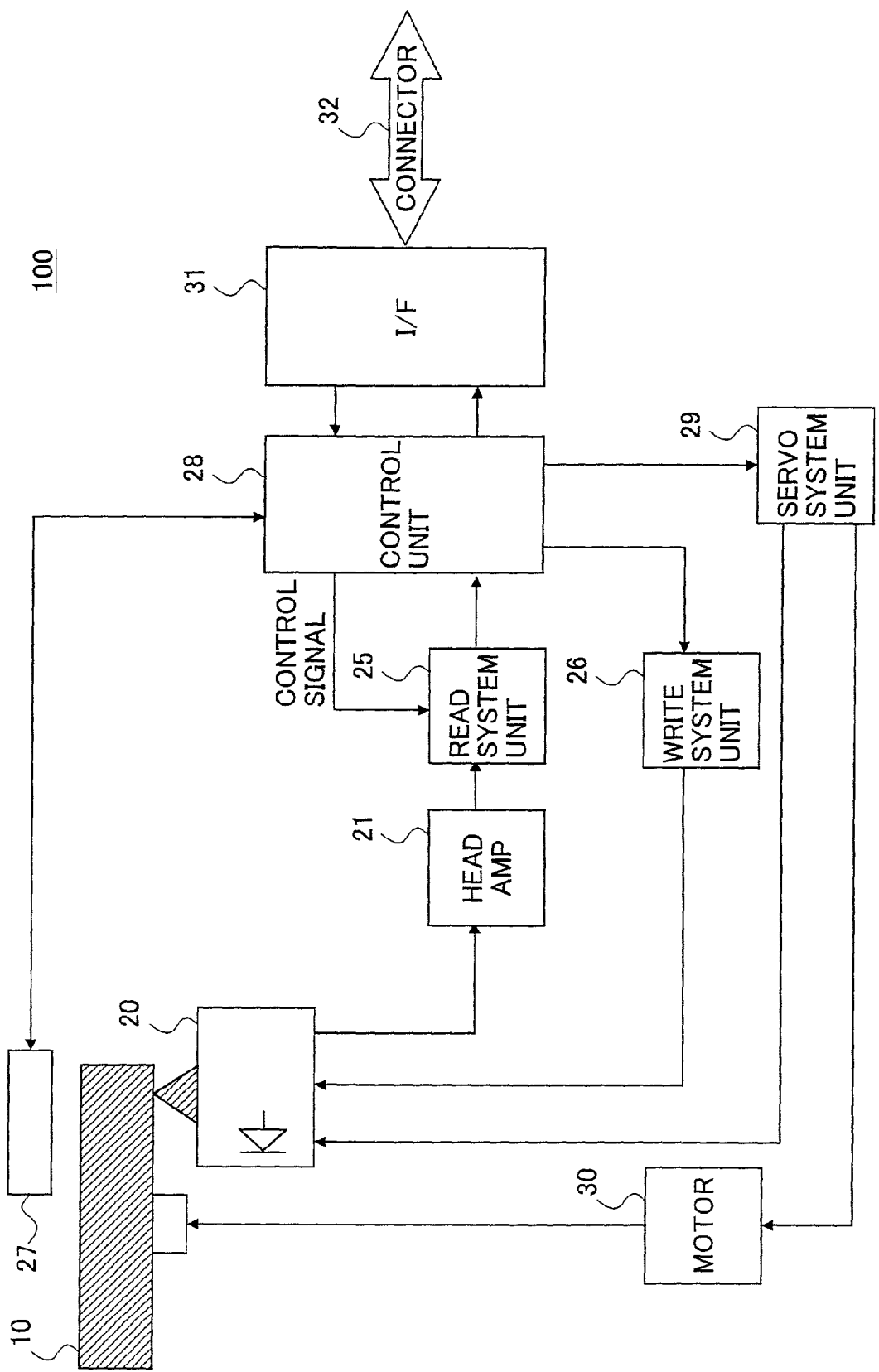
FIG. 2 is a diagram showing a configuration example of a magneto-optical disc as a data recording/reproducing apparatus according to an embodiment of the present invention.

A magneto-optical disc device 100 as a data recording/reproducing apparatus according to the embodiment of the present invention can be configured as shown in FIG. 2.

Referring to FIG. 2, the magneto-optical disc apparatus 100 includes a magneto-optical disc 10 as a recording medium, an optical head 20, a head AMP (amplifier) 21, a read system unit 25, a write system unit 26, an electromagnet 27, a control unit 28, a servo system unit 29, and a motor 30. The control unit 28 controls the read system unit 25, the write system unit 26, and the servo system unit 29 in accordance with a data read instruction or a data write instruction supplied from an external unit (not shown) via an interface 31.

The read system unit 25, which is controlled by the control unit 28 based on the data read instruction, inputs a reproduction signal output from an optical head 20 optically scanning the magneto-optical disc 10, and reproduces read data in accordance with a demodulation technique (described later) corresponding to the Viterbi decoding technique and the run length limitation rule. In addition, the write system unit 26 controlled by the control unit 28 based on the data write instruction modulates data supplied from an external unit through the control unit 28 in accordance with the predetermined run length limitation rule (for example, (1,7)RLL). Subsequently, the write system unit 26 controls to actuate the optical head 20 based on the data obtained by the modulation so as to write the record signal in accordance with the partial response (for example, PR(11)) waveform in the magneto-optical disc 10. When the data is written in the magneto-optical disc 10, the control unit 28 controls the electromagnet 27 that generates a magnetic field to the magneto-optical disc 10.

In addition, the servo system unit 29, which is controlled by the control unit 28 based on the data read instruction or the data write instruction, positions the optical head 20 at a write position or a read position on the magneto-optical disc 10 while rotating the magneto-optical disc 10 at a predetermined speed by actuating the motor 30.

Figure 3:
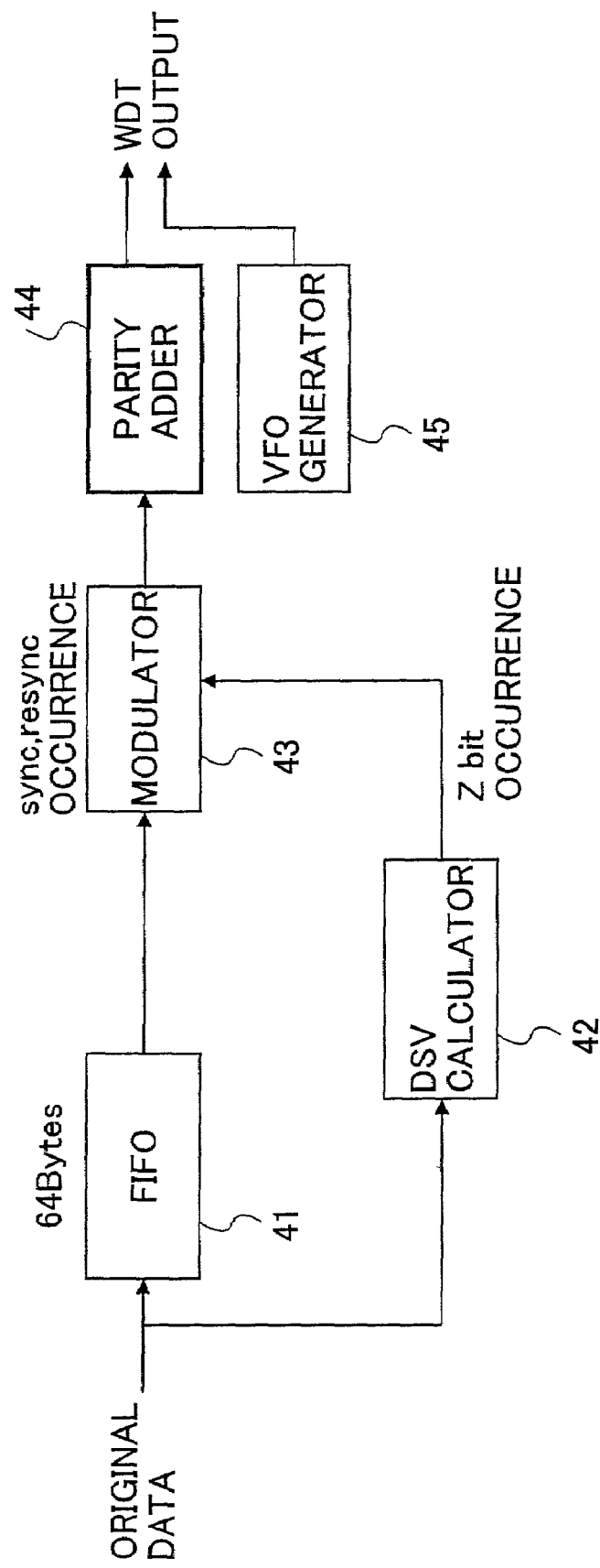
FIG. 3 is a block diagram showing an example of a partial configuration with which a write system unit shown in FIG. 2 is provided.

For example, the write system unit 26 includes a circuit component as shown in FIG. 3.

That is, the write system unit 26 includes a FIFO (First In First Out) register 41, a DSV (Digital Sum Value) calculator 42, a modulator 43, a parity adder 44, and a VFO (variable frequency oscillator) generator 45. The FIFO register 41 stores the original data while sequentially shifting one bit of the original data, and sequentially outputs each bit of the original data in a storing order. The DSV calculator 42 calculates the number of "1"s and the number of "0"s for every predetermined length in the original data, and generates "1" bit or/and "0" bit (Z bit) necessary to correct an unbalance between the number of "1"s and the number of "0"s.

The modulation circuit 43 additionally provides a "resync" bit including a "sync" bit for a timing control and the Z bit from the DSV calculator 42 at a predetermined location of the original data supplied from the FIFO register 41. And the modulator 43 modulates the original data, in which the "sync" bit and the "resync" bit are additionally provided, in accordance with a (1,7)RLL (Run Length Limited) rule and a NRZI (Non Return Zero Inverted) rule. By modulating in accordance with the (1,7)RLL rule, N bits as a predetermined length in the original data (including the "sync" bit and the "resync" bit) are converted into 3/2N bits as a predetermined length of lengthened data.

Figure 4:
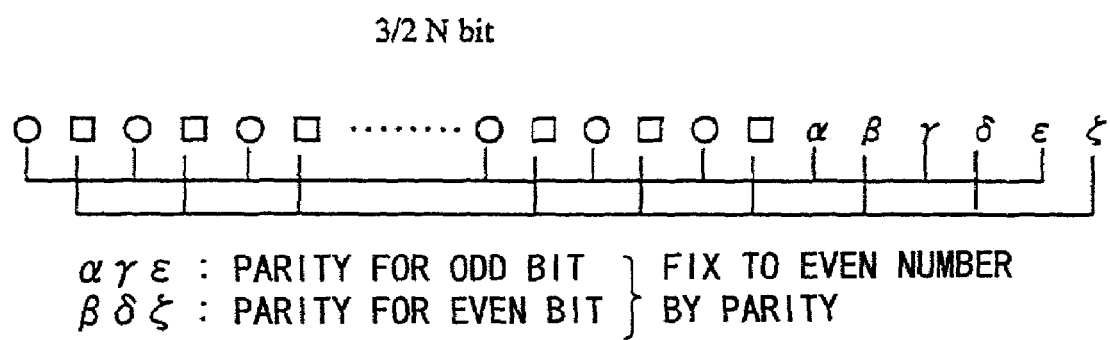
FIG. 4 is a diagram showing an example of a parity addition rule.

The parity adder 44 additionally provides the parity bits every 3/2N bits in the lengthened data obtained by the modulator 43. For example, as shown in FIG. 4, six parity bits of $\alpha$, $\beta$, $\gamma$, $\delta$, $\epsilon$, and $\zeta$ are additionally provided every 3/2N bits. $\alpha$, $\gamma$, and $\epsilon$ are even parities for an odd bit, and each value ("0" or "1") of the parity bits of $\alpha$, $\gamma$, and $\epsilon$ is defined so that the number of "1"s in a bit sequence including an odd-numbered bit (○ (round) mark) and the parity bits of $\alpha$, $\gamma$, and $\epsilon$ is even.

Moreover, the parity bits of $\beta$, $\delta$, and $\zeta$ are an odd parity bit, and each value ("0" or "1") of the parity bits of $\beta$, $\delta$, and $\zeta$ is defined so that the number of "1"s in a bit sequence including an even-numbered bit (□ (square) mark) and the parity bits of $\alpha$, $\gamma$, and $\epsilon$ is even.

As described above, the six parity bits of $\alpha$, $\beta$, $\gamma$, $\delta$, $\epsilon$, and $\zeta$ are additionally provided every 3/2N bits. Thus, it is possible to detect an error in which a successive error length is less than two bits in a length of the 3/2N bits while reproducing the record data. In this example, since data modulated in accordance with the (1,7)RLL rule and the NRZI rule are recorded, the successive error length of the error, which occurs when the record data are reproduced, is one bit in almost all cases. Consequently, since the six parity bits of $\alpha$, $\beta$, $\gamma$, $\delta$, $\epsilon$, and $\zeta$ are additionally provided, it is possible to properly detect the error when reproducing the record data.

The VFO generator 45 generates VFO data used as a predetermined repetition pattern. And the write system unit 26 outputs the VFO data from the VFO generator 45 as write data WDT for a VFO area on the magneto-optical disc 10. Also, the parity adder 44 outputs data as the write data WDT for the VFO area on the magneto-optical disc 10.

Figure 5:
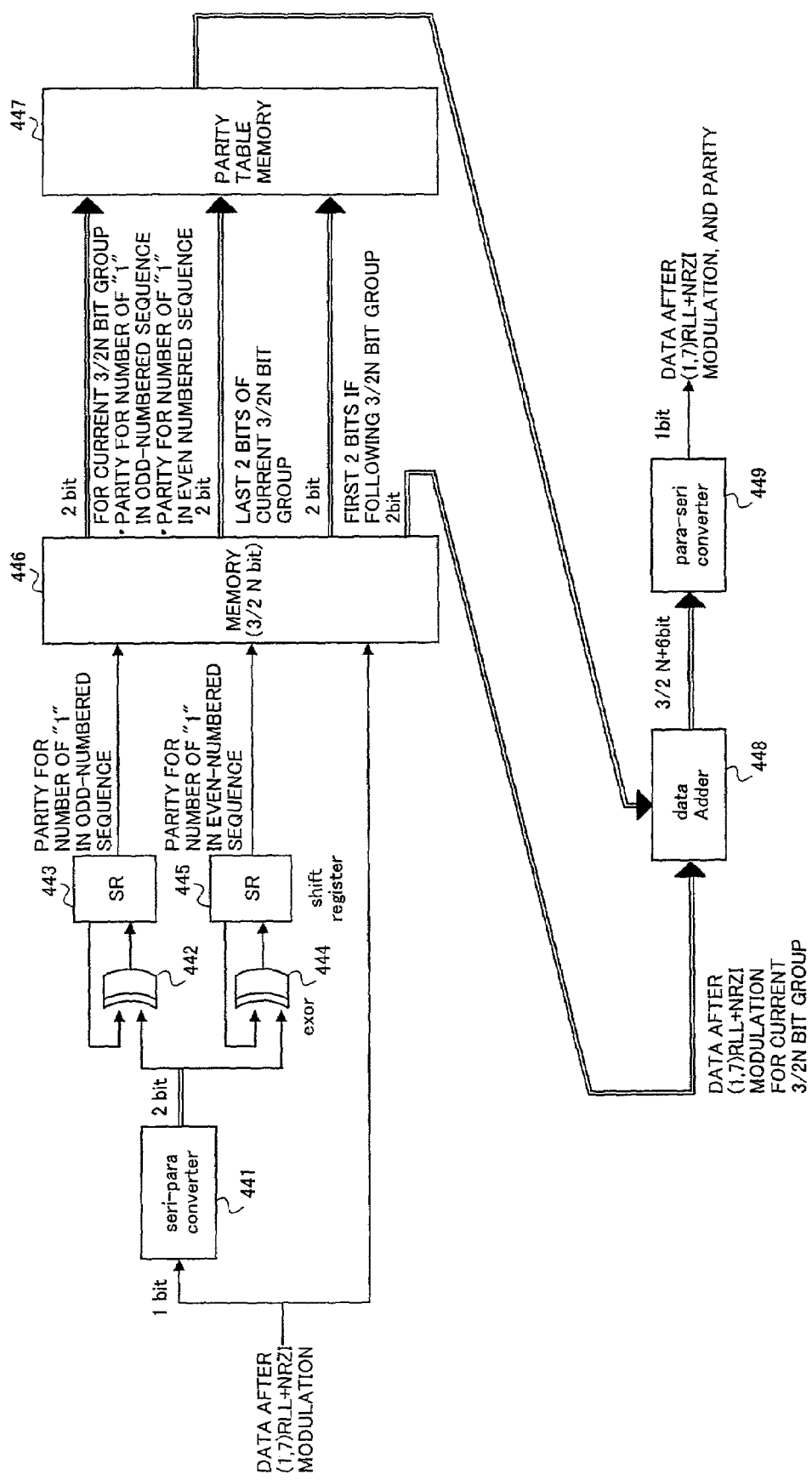
FIG. 5 is a block diagram showing a configuration example of a parity adder in the partial configuration shown in FIG. 3.

For example, the parity adder 44 can be configured as shown in FIG. 5.

In FIG. 5, the parity adder 44 includes a seri-para converter 441, two exclusive logical sum (EXOR) circuits 442 and 444, two shift registers 443 and 445, and a memory unit 446. Moreover, the parity adder 44 includes a parity table memory 447, a data coupler 448, and a para-seri converter 449. The seri-para converter 441 inputs data, which are modulated and output by the modulator 43, every one bit, and outputs the data every two bits (an odd-numbered bit and an even-numbered bit input by the seri-para converter 441) in parallel.

The exclusive logical sum circuit 442 calculates an exclusive logical sum of the odd-numbered bit output from the seri-para converter 441 and an output of the exclusive logical sum circuit 441 stored in the shift register 443 last time. An output of the exclusive logical sum circuit 442 is set to "1" if every time the odd-numbered bit is supplied, the number of "1"s in the odd-numbered bit sequence supplied until that time is odd. On the other hand, the output of the exclusive logical sum circuit 442 is set to "0" if the number of "1"s is even.

The exclusive logical sum circuit 444 calculates the exclusive logical sum of the even-numbered bit output from the seri-para converter 441, and an output of the exclusive logical sum circuit 444 stored in the shift register 445 last time. An output of the exclusive logical sum circuit 444 is set to "1" if every time the even-numbered bit is supplied, the number of "1"s in the even-numbered bit sequence supplied until that time is odd. On the other hand, the output of the exclusive logical sum circuit 444 is set to "0" if the number of "1"s is even.

That is, an output bit of the shift register 443 shows whether the number of "1"s in the odd-numbered bit sequence is even or odd. An output of the shift register 445 shows whether the number of "1"s in the even-numbered bit sequence is even or odd. Hereinafter, the output of the shift register 443 is called an odd/even bit in an odd number sequence and the output of the shift register 445 is called an odd/even bit in an even number sequence.

The memory unit 446 stores data modulated and output from the modulator 43 per 3/2N bit unit and also stores the odd/even bit of the odd number sequence from the shift register 443 and the odd/even bit of the even number sequence from the shift register 445. By controlling to read bits from the memory unit 446, the memory unit 446 outputs the 3/2N bit sequence after the modulation (hereinafter, called current 3/2N bit group if needed), the odd/even bit of the odd number sequence obtained from the current 3/2 N bit group and the odd/even bit of the even number sequence, last two bits of the current 3/2N bit group to which the parity bit should be added, and first two bits of the next 3/2N bit sequence (hereinafter, called following 3/2N bit group if needed) following the current 3/2N bit group.

Six bits of the odd/even bit of the odd number sequence output from the memory unit 446, the odd/even bit of the even number sequence, the last two bits of the current 3/2N bit group to which the parity bit should be added, and the first two bits of the following 3/2N bit group are input into the parity table memory 447. In the parity table memory 447, the parity bits ($\alpha$, $\beta$, $\gamma$, $\delta$, $\epsilon$, and $\zeta$ shown in FIG. 4), which are predetermined in a condition of the six bits input into the parity table memory 447, are stored. When the even/odd bit in the odd number sequence, the even/odd bit in the even number sequence, the last two bits of the current 3/2N bit group, and the first two bits of the following 3/2N bit group in the current 3/2N bit group are input into the parity table memory 447 as input bits, the parity table memory 447 outputs the parity bits corresponding to input bits.

The parity bits stored in the parity table memory 447 are defined as follows:

The parity bit added after the last bit of the current 3/2N bit group follows a head bit of the following 3/2N bit group. The current 3/2N bit group and the following 3/2N bit group satisfy the (1,7)RLL rule. In order for the current 3/2N bit group and the following 3/2N bit group, which have successive parity bits, to satisfy a part of the (1,7)RLL rule (d=1 restriction) as a whole, it is required that the six bits themselves as parity bits satisfy the part of the (1,7)RLL rule (d=1 restriction), and that the part of the (1,7)RLL rule (d=1 restriction) should be satisfied in a successive arbitrary range from the current 3/2N bit group to the parity bits and a successive arbitrary range from the parity bits to the following 3/2N bit group.

In order to satisfy the run length limitation rule, it is required to consider data having a constant length in a range from the current 3/2N bit group to the parity bits, a range of the parity bits, and a range from a parity bit to the following 3/2N bit group. If it is needed to satisfy a whole of the (1,7)RLL rule, at least ten bits should be considered. However, in the embodiment of the present invention, d restriction (rule in which the shortest value of d=1, 0 is 1), which is one of the (1,7)RLL rules, is observed and then three bits are considered. Then, the parity bits are defined so as that total four bits of the last two bits of the current 3/2N bit group and the first two bits of six bit parity following the current 3/2N bit group satisfy the d restriction, and also total four bits of the last two bits of the six bit parity bits and the first two bits of the following 3/2N bit group satisfy the d restriction, based on the odd/even bit of the odd number sequence in the current 3/2N bit group, and the odd/even bit of the even number sequence.

The parity bits defined as described above are stored in the parity table memory 447 so as to correspond to a set including the odd/even bit of the odd number sequence and the odd/even bit of the even number sequence in the current 3/2N bit group, the last two bits in the current 3/2N bit group, and the first two bits in the following 3/2N bit group.

The parity bits (six bits) defined as described above correspond to a condition expressed by six bits including the odd/even bit of the odd number sequence and the odd/even bit of the even number sequence in the current 3/2N bit group, the last two bits in the current 3/2N bit group, and the first two bits in the following 3/2N bit group. The condition expressed by the six bits described above indicates one of 64 ways. Sixty four combinations by the parity bits (six bits), which correspond to 64 conditions, respectively, are stored in the parity table memory 447.

The number of the parity bits is set to six because when the parity bits are less than five bits, all conditions (64 ways) cannot satisfy a part (d=1 restriction) of the (1,7)RLL.

The parity bits read from the parity table memory 447 and the current 3/2N bit group read from the memory unit 446 are supplied to the data coupler 448. The data coupler 448 combines the parity bits ($\alpha$, $\beta$, $\gamma$, $\delta$, $\epsilon$, and $\zeta$) shown in FIG. 4 with after the 3/2N bit group. The current 3/2N bit group and the parity bits, which are combined together, are sequentially output from a head bit of the current 3/2N bit group through the para-seri converter 449 every one bit.

The part (d=1 restriction) of the (1,7) RLL rule and data in a 3/2N bit unit modulated in accordance with the NRZI rule, and the parity bits (six bits) are alternately arranged by the parity adder 44 to form a bit sequence. The bit sequence always satisfies the part (d=1 restriction) of the (1,7)RLL rule. Accordingly, in the read system, it is possible to conduct a parity check corresponding to the bit sequence obtained before a demodulating process with respect to the run length limitation.

In the embodiment, the parity bits are additionally provided so as to satisfy the part (d=1 restrictions) of the (1,7)RLL. Alternatively, the parity bits are additionally provided so as to satisfy the entire (1,7)RLL or further satisfy other run length limitations.

As described above, the write system unit 26 controls to actuate the optical head 20 based on a data sequence in which the parity bits are additionally provided. The data sequence in which the parity bits are additionally provided is written on the magneto-optical disc 10.

Figure 6:
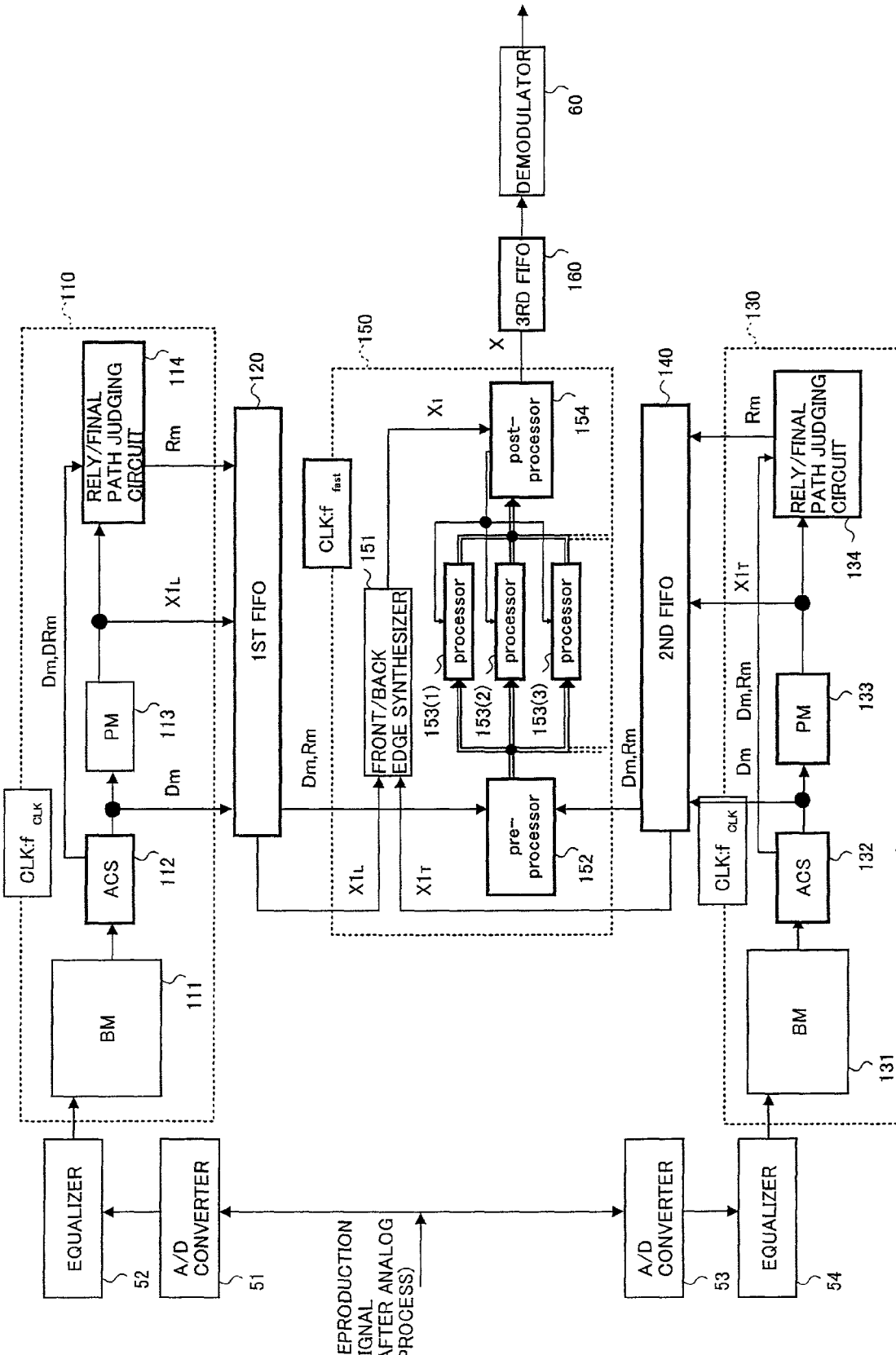
FIG. 6 is a block diagram showing a first configuration example of a read system.

For example, the read system unit 25 can be configured as shown in FIG. 6. The read system unit 25 includes a front edge system for reproducing data from a sampling value obtained synthesizing with the leading edge (front edge) of the reproduction signal in accordance with an ML (most likelihood) technique, and a back edge system for reproducing the data from a sampling data obtained synthesizing with the trailing edge (front edge) of the reproduction signal in accordance with the ML technique.

In FIG. 6, the read system unit 25 as the front edge system includes an analog to digital converter (hereinafter, called A/D converter) 51, an equalizer 52, a basic information generating circuit 110, and a FIFO memory 120. Moreover, similar to the front edge system, the read system unit 25 includes an A/D converter 53, an equalizer 54, a basic information generating circuit 130, and a FIFO memory 140, as the back edge system. Furthermore, the read system unit 25 includes a processing circuit 150 to be shared by the front edge system and the back edge system as well as a FIFO memory 160 and a demodulator 60.

In a process in which the optical head 20 optically scans the magneto-optical disc 10 on which data are written, the reproduction signal (MO signal) output from the optical head 20 inputs into the A/D converters 51 and 53 through the amplifier 21. The A/D converter 51 samples the reproduction signal synchronizing with a clock signal (hereinafter, called front edge clock) that synchronizes with the leading edge (front edge) of the reproduction signal. Moreover, the A/D converter 53 samples the reproduction signal synchronizing with a clock signal (hereinafter, called back edge clock) that synchronizes with the trailing edge (back edge) of the reproduction signal.

In addition, the frequency of the front edge clock is the same as that of the back edge clock.

The equalizer 52 sequentially inputs the sampling values from the A/D converter 51, and conducts a digital waveform equalizing process so as to equalize the sampling values to be a predetermined PR waveform (for example, a PR(11) waveform) And the sampling values passed through the digital waveform equalizing process are sequentially supplied to the basic information generating circuit 110. The equalizer 54 conducts the digital waveform equalizing process with respect to the sampling values input sequentially from the A/D converter 53, and sequentially supplies the sampling values that are equalized to the predetermined PR waveform to the basic information generating circuit 130.

The basic information generating circuit 110 of the front edge system operates synchronizing with the front edge clock (CLK:$f_{CLK}$), and generates various basic information described later. The basic information generating circuit 130 of the back edge system operates synchronizing with the back edge clock (CLK:$f_{CLK}$), and generates the various basic information. While the various basic information generated by the basic information generating circuit 110 is supplied to the processing circuit 150 through the FIFO memory 120, the various basic information generated by the basic information generating circuit 130 is supplied to the processing circuit 150 through the FIFO memory 140.

The processing circuit 150 generates the final detected data based on the basic information accumulated in the FIFO memories 120 and 140. The processing circuit 150 processes synchronizing with a clock (CLK:$f_{fast}$) of a cycle (high speed) shorter than a synchronous clock for each of the basic information generating circuits 110 and 130. Consequently, a process delay at the processing circuit 150 is set to be at minimum.

Figure 1:
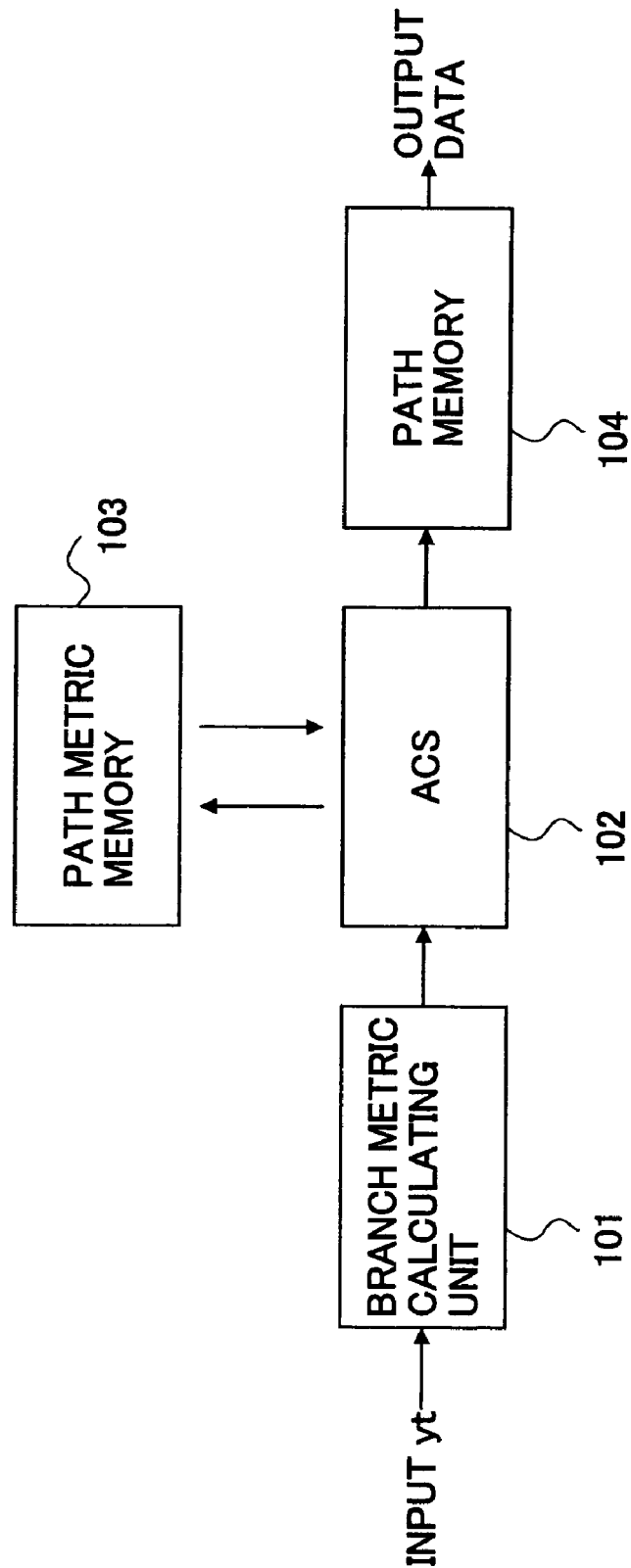
FIG. 1 is a block diagram showing a basic configuration of a Viterbi detector.

The basic information generating circuit 110 of the front edge system includes a BM (branch metric calculating unit) 111, an ACS (addition-comparison-selection unit) 122, and a PM (path memory) 113. In addition, although the PMM (path metric memory) is actually provided similar to a configuration shown in FIG. 1, the PMM is omitted in FIG. 6, for the sake of convenience. The basic information generating circuit 110 further includes a rely/final path judging circuit 114.

The BM 111 calculates a BM value (branch metric value) which is a difference between the sampling value yt obtained synchronizing with the front edge clock supplied through the equalizer 52, and each expected value depending on the PR waveform. Similar to a conventional configuration, the ACS 112 adds a BM value from the BM 111 to a PM value before one clock (Add). After that, the ACS 112 compares two PM values corresponding to two paths that result in a certain state (Compare). Then, the ACS 112 selects a smaller one from the two PM values as a new PM value (Select). That is, the ACS 112 selects a path corresponding to a smaller PM value from the two paths resulting in a certain state.

In details, in the following equation:

$$PM_m = \min\{PM_i + BM_j, PM_k + BM_1\},$$

a selection path Dm=1 is output when the former in parentheses {} is selected, and a selection path Dm=0 is output when the latter are selected.

For example, in a case of a PR(110) of a constraint length 3, as shown in FIG. 7, four states S0, S1, S2, and S3 are defined based on the relationship of successive data of two bit values (1 or 0). A selection path D0=0 is output if an upper path is selected from two paths S0→S0 and S1→S0 toward the state S0 and a selection path DO=1 is output if a lower path is selected from two paths S0→S0 and S1→S0 toward the state S0.

Moreover, in two paths S2→S1 and S3→S1 toward the state S1, an upper path is a path that cannot exist by the d restriction of the (1,7)RLL rule, and then a lower path is selected. Consequently, a selection path D1=0 is output.

In two paths S0→S2 and S1→S2 that result in the state S2, a lower path is a path that cannot exist by the d restriction, and then an upper path is selected. Consequently, selection path D2=0 is output.

Furthermore, in two paths S2→S3 and S3→S3 toward the state S3, a selection path D3=0 is output if an upper path is selected and a selection path D3=1 is output if a lower path is selected.

The ACS 112 calculates a difference between two PM values respectively corresponding to the two paths described above, a comparison operation is conducted to compare a PM judging value (J–PM value) to be a predetermined reference value with the difference. Based on the result of the comparison operation, a reliability DRm of the path selected as described above is defined as follows:

$DRm=1$ when $|PMi+BMj-PMk+BMl|<J-PM$, and $DRm=0$ when $|PMi+BMj-PMk+BMl|>=J-PM$.

That is, when the difference between the two PM values is smaller than the PM judging value J–PM, it is determined that the reliability of the path corresponding to the PM value is relatively lower. Thus, the reliability DRm is set as "1" (DRm=1).

Moreover, when the difference between the two PM values is greater than the PM judging value J–PM, it is determined that the reliability of the path corresponding to the PM value is relatively higher. Thus, the reliability DRm is set as "0" (DRm=0).

As mentioned above, the ACS 112 outputs the group of reliabilities DRm (for example, DR0, DR1, DR2, and DR3) corresponding to the group of the selection paths Dm (for example, D0, D1, D2, and D3), by synchronizing with the front edge clock. Each selection path Dm is supplied as basic information to the FIFO memory 120 and also the selection path Dm and the reliability DRm corresponding to the selection path Dm are supplied to the rely/final path judging circuit 114.

Similar to a conventional path memory, the path memory 113 sequentially shifts the group of the selection path Dm sequentially supplied from the ACS 112. The data corresponding to each path that should not have been selected based on a succession of a transition state in the process are selectively eliminated. And the path memory 113 outputs data corresponding to a survival path as front edge candidate data X1L. This front edge candidate data X1L is supplied to the FIFO memory 120 as the basic information while it is supplied to the final path judging circuit 114.

The final path judging circuit 114 determines the selection path Dm corresponding to the front edge candidate data X1L output from the path memory 113, as a final selection path DXm. Moreover, based on the selection path Dm from the ACS 112 and the reliability DRm corresponding to the selection path Dm, the final path judging circuit 114 determines the path corresponding to the reliability DRm (lower reliability) set as "1" among the selection paths Dm determined as the final selection path DXm as described above, as a reverse candidate (Rm=1). Based on the selection path Dm from the ACS 112 and the reliability DRm corresponding to the selection path Dm, for example, the final path judging circuit 114 is configured as shown in FIG. 8.

Figure 8:
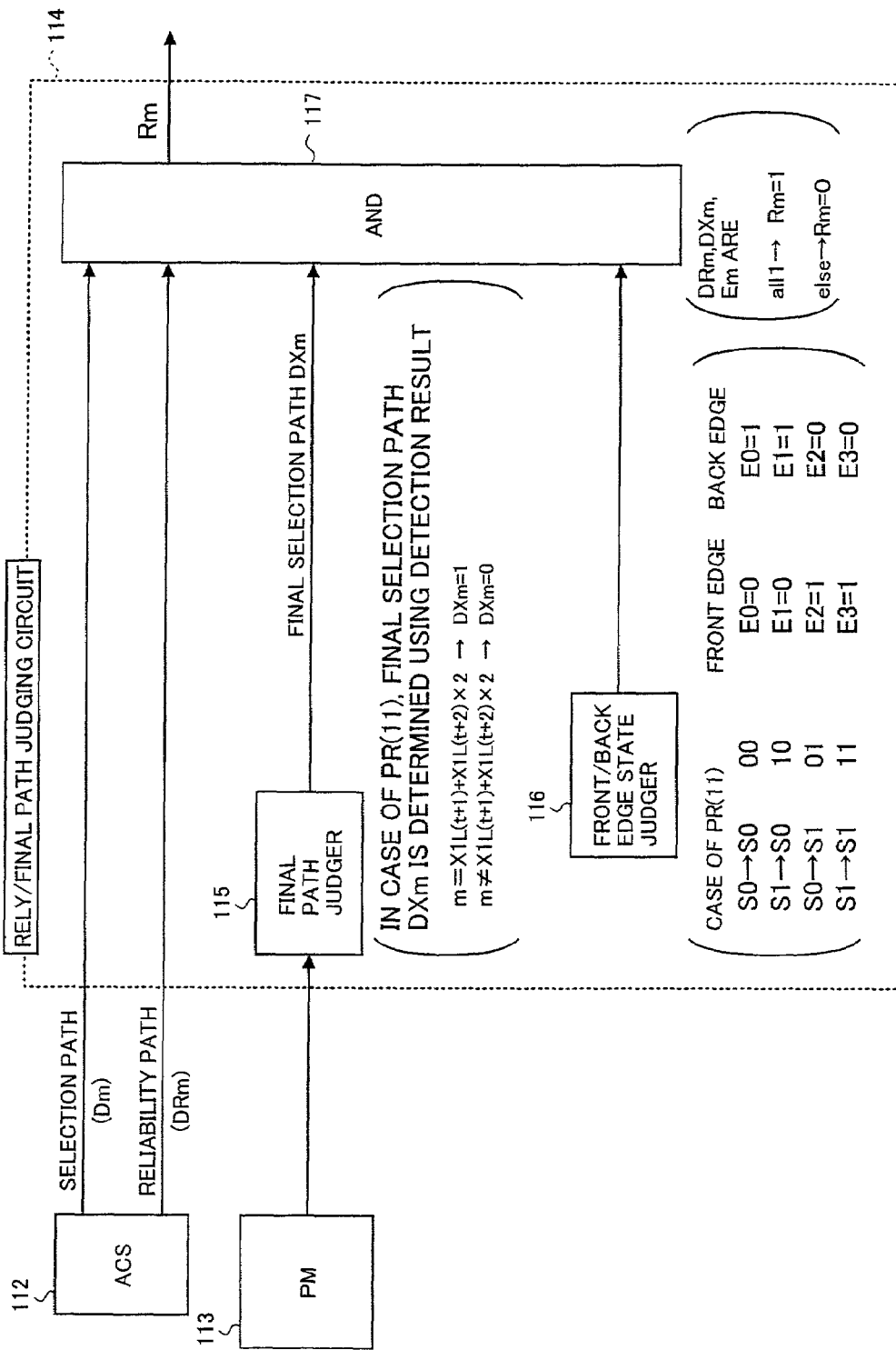
FIG. 8 is a diagram showing a configuration example of a rely/final selection path determining circuit in the read system unit shown in FIG. 6.

In FIG. 8, the final path judging circuit 114 includes a final path determination circuit 115, a front-back edge state judging circuit 116, and an AND circuit 117. As mentioned above, for example, based on the front edge candidate data X1L from the path memory 113, the final path judger 115 determines the final selection path DXm (DXm=1) according to the following conditions:

$DXm=1$ when $m=X1L(t+1)+X1L(t+2)\times 2$, and $DXm=0$ when $m+X1L(t+1)+X1L(t+2)\times 2$.

For example, in a case in which each transition path between states S0, S1, S2, and S3 as indicated by arrows in FIG. 9A, is sequentially output as the selection path Dm from the ACS 112, from the front edge candidate data X1L ( . . . 000110000 . . . ) to be an output of the path memory 113 based on the selection path Dm, the final selection path DXm showing one transition path indicated by a thick line in FIG. 9A is determined.

In the front edge system, since data are reproduced based on the sample value yt obtained from the reproduction signal by synchronizing with the front edge clock, although the reliability of the sampling value obtained in a front edge portion of the reproduction signal is higher, the reliability of the sample value obtained in a trailing edge (back edge) portion of the reproduction signal is lower. Therefore, in the final path judging circuit 114 in the basic information generating circuit 110 of the front edge system, the reverse candidate (Rm=1) is determined from the selection path corresponding to the front edge portion.

For example, as shown in FIG. 9A, the path toward the states S2 and S3 corresponds to the front edge (leading edge). Accordingly, edge status outputs Em from the front-back edge state judging circuit 116 of the final path judging circuit 114 in the front edge system are set as follows:

$E_0=0$
$E_1=0$
$E_2=1$
$E_3=1$.

The AND circuit 117 inputs the reliability DRm, the final selection path DXm, and the edge status output Em. When all of the final selection path DXm, and the edge status output Em are "1", the selection path Dm with lower reliability is determined as the reverse candidate (Rm=1) from the selection paths determined as the final selection path in the front edge portion. When either of the reliability DRm, the final selection path DXm and the edge status output Em is "0", the selection path Dm is not set as the reverse candidate (Rm=0).

As described above, the reverse candidate data Rm (1 or 0) obtained in the final path judging circuit 114 is supplied to the FIFO memory 120 as the basic information.

On the other hand, the basic information generating circuit 130 of the back edge system, similar to the basic information generating circuit 110 in the front edge system, includes a BM 131, an ACS 132, a path memory 133, and a Rely/Final Path Judging circuit 134. The basic information generating circuit 130, similar to the basic information generating circuit 110 in the front edge system, generates the selection path Dm, back edge candidate data X1T, and the reverse candidate data Rm as the basic information from the sampling value obtained synchronizing with the back edge clock supplied through the equalizer 54. Then, the basic information generating circuit 130 supplies the basic information to the FIFO memory 140.

The final selection path judging circuit 134 in the basic information generating circuit 130 is configured as shown in FIG. 8, similar to the front edge system.

The final path judger 115 determines the final selection path DXm (DXm=1) from the back edge candidate data X1T from the path memory 132 by the same technique as the front edge system. For example, in a case in which each transition path between the states S0, S1, S2, and S3 as indicated by arrows in FIG. 9B, is sequentially output as the selection path Dm from the ACS 132, from the back edge candidate data X1L ( . . . 000110000 . . . ) to be an output of the path memory 132 based on the selection path Dm, the final selection path DXm showing one transition path indicated by a thick line in FIG. 9B is determined.

In the back edge system, contrary to the front edge system, since data are reproduced based on the sample value yt obtained from the reproduction signal by synchronizing with the back edge clock, although the reliability of the sampling value obtained in a back edge portion of the reproduction signal is higher, the reliability of the sample value obtained in a leading edge (front edge) portion of the reproduction signal is lower. Therefore, in the final path judging circuit 134 in the basic information generating circuit 130 of the back edge system, the reverse candidate (Rm=1) is determined from the selection path corresponding to the back edge portion.

For example, as shown in FIG. 9B, the path toward the states S0 and S1 corresponds to the back edge (trailing edge). Accordingly, the edge status outputs Em from the front-back edge state judging circuit 116 of the final path judging circuit 134 in the back edge system are set as follows:

$E_0=1$
$E_1=1$
$E_2=0$
$E_3=0$.

As described above, the AND circuit 117 inputs the reliability DRm, the final selection path DXm, and the edge status output Em. When all of the final selection path DXm, and the edge status output Em are "1", the selection path Dm with lower reliability is determined as the reverse candidate (Rm=1) from the selection paths determined as the final selection path in the back edge portion. When either of the reliability DRm, the final selection path DXm and the edge status output Em is "0", the selection path Dm is not set as the reverse candidate (Rm=0).

The processing circuit 150 obtains the selection path Dm, the reverse candidate data Rm, the front edge candidate data X1L, and the back edge candidate data X1T from the FIFO memory 120 and the FIFO memory 140 every bit number (3/2N+6) of unit data in which the parity bits are additionally provided (hereinafter, 3/2N+6 is simply shown as <N>). The processing circuit 150 includes a front-back edge synthesizer 151, a pre-processor 152, a plurality of processors 153(1), 153(2), and 153(3) (hereinafter, called processors 153(*i*)), and a post-processor 154.

The front-back edge synthesizer 151 synthesizes the front edge candidate data X1L with the back edge candidate data X1T, and generates the main candidate data X1. For example, by the front edge candidate data X1L ( . . . 000110000 . . . ) as shown in FIG. 9A and the back edge candidate data X1T ( . . . 000011000) as shown in FIG. 9B, the main candidate data X1 ( . . . 000111000 . . . ) as shown in FIG. 9C are generated.

The pre-processor 152 sets the operation number I based on the number of reverse candidates (Rm=1) in both the front edge system and the back edge system obtained from the FIFO memories 120 and 140, and also provides an order label (L) to each reverse candidate (Rm=1).

$I = \Sigma Rm(t)(t:t-t+<N>, m:0 \text{ through } 3)$ $L: 1 \text{ through } I$

And the front processor 152 distributes each group of the reverse candidates (Rm=1) and the selection path Dm (that are obtained in both the front edge system and the back edge system) to processors 153(*i*) in accordance with the order label L. When the number of reverse candidates (Rm=1) is larger than the number K of the processors 153(*i*), the selection path Dm and the reverse candidate (Rm=1) are entirely distributed to the processors 153(1) through 153(K). After an operation described later is conducted to each of the processor 153(*i*) (i= 1 through K), the reverse candidate (Rm=1) and selection path Dm for remaining labels L(K+1-I) are further distributed to each of the processors 153(*i*).

Each of the processors 153(i) includes a processing part (not shown) and a path memory 2 (not shown) having the same function as the path memories 112 and 132. The processing part mixes the selection pass Dm from the front edge system and the selection pass Dm from the back edge system. As described above, for example, in a case of the PR (11) of a constraint length 3, the path toward the states S2 and S3 corresponds to the front edge, and the path toward the states S0 and S1 corresponds to the back edge. Accordingly, for example, the processing part of each of the processors 153($i$) mixes the selection path toward the states S2 and S3 among the selection paths Dm from the front edge system shown by the arrows in FIG. 9A with the selection path toward the states S0 and S1 among the selection paths Dm from the back edge system shown by the arrows in FIG. 9B. The selection paths Dm shown by arrows in FIG. 9C are obtained after the mixing operation.

When the selection path Dm after the mixing operation is obtained, the processing part reverses the selection path corresponding to the reverse candidate (Rm=1) among the selection path Dm after the mixing operation. For example, when the reverse candidate (Rm=1) corresponds to a certain selection path transiting from the states S2 to S3 among the selection paths Dm after the mixing operation indicated by the arrows in FIG. 9C, the selection path resulting in the state S3 is reversed. As a result, the selection path transiting from the state S2 to the state S3 is changed into the selection path transiting from the state S3 to the state S3.

Thus, the selection path Dm after the mixing operation, in which the path corresponding to the reverse candidate (Rm=1) is changed, is supplied to the path memory 2 from the processing part. While shifting the selection path Dm sequentially supplied, the path memory 2 selectively eliminates data corresponding to each path that should not be selected based on the succession of the transition state. And data corresponding to the survival path is output as sub candidate data X2$i$ being the i-th data from the path memory 2.

In each of the processors 153($i$), the sub candidate data X2$i$ (<N>bit) is generated based on the selection path in which every one path having lower reliability is changed. Then, each of the processors 153($i$) supplies the sub candidate data X2$i$ to the post-processor 154. The post-processor 154 conducts a parity check with respect to the sub candidate data X2$i$ that is supplied from the main candidate data X1 (<N>bit) generated by the front-back edge synthesizer 151 and from each of the processors 153($i$). The parity check is conducted based on the addition rule of the parity bits ($\alpha$, $\beta$, $\gamma$, $\delta$, $\epsilon$, and $\zeta$) described above. For example, the number of "1"s in the bit sequence of each candidate data (X1, X2$i$) is counted and then it is determined whether the number of "1"s is even or odd.

If the number of "1"s included in the bit sequence of the main candidate data X1 is even and it is determined that the parity is normal in process of the operation, the post-processor 154 outputs the main candidate data X1 as the final detection result X and also a control signal for an operation stop is output to each of the processors 153($i$). Thereby, after that, each of the processors 153($i$) does not conduct the operation for generating the sub candidate data.

Moreover, the number of "1"s included in the bit sequence of the main candidate data X1 is odd, the number of "1"s included in an i-th bit sequence of the sub candidate data X2$i$ is even, and it is determined that the parity is normal. The post-processor 154 outputs an i-th sub candidate data X2 as a final result X and also outputs the control signal of the operation stop with respect to each of the processors 153($i$). Thereby, after that, each of the processors 153($i$) does not conduct the operation for generating the sub candidate data.

Furthermore, in a case in which a normal parity check result cannot be obtained for any of the main candidate data X1 and sub candidate data obtained by one operation, the post-processor 154 outputs the main candidate data X1 as a final detection result X.

As described above, the final detection result X output, from the post-processor 154 is supplied to the demodulator 60 via the FIFO memory 160. For example, the demodulator 60 is configured as shown in FIG. 10.

Figure 10:
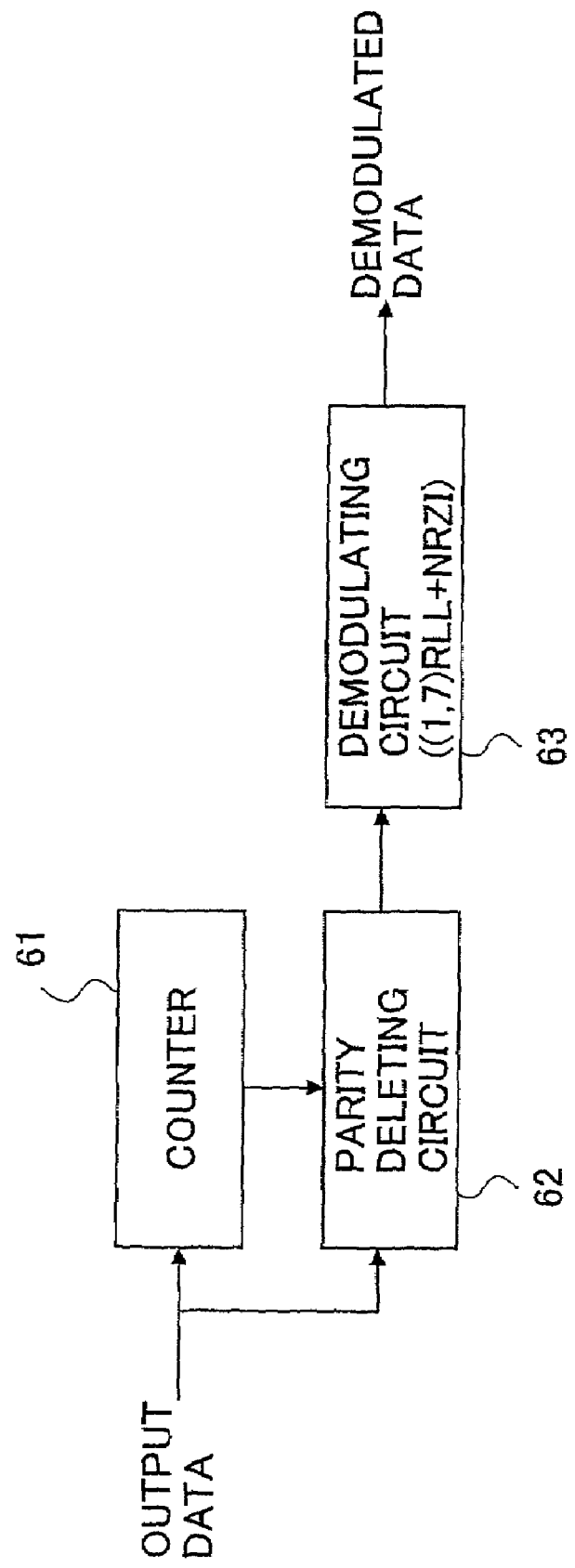
FIG. 10 is a block diagram showing a configuration example of a demodulator in the read system shown in FIG. 6.

In FIG. 10, the demodulator 60 includes a counter 61, a parity deleting circuit 62, and a demodulating circuit 63. The counter 61 increments a count value by one count every time data are supplied by one bit from the FIFO memory 160 and also resets the count value to zero every time the count value achieves <N>(3/2N+6 bit). The parity deleting circuit 62 monitors the count value of the counter 61, and also sequentially inputs data by every one bit from the FIFO memory 160 so as to supply the demodulating circuit 63. In that process, if the parity deleting circuit 62 detects a head of the parity bits ($\alpha$, $\beta$, $\gamma$, $\delta$, $\epsilon$, and $\zeta$) based on the count value of the counter 61, six bits are deleted from the head as the parity bits. As a result, data are supplied to the demodulating circuit 63 by every 3/2N bits.

The demodulating circuit 63 demodulates to 3/2-N bit sequence input to N-bit data in accordance with the (1,7) RLL rule and the demodulation rule corresponding to the NRZI rule. Subsequently, the demodulating circuit 63 sequentially outputs data reproduced as the original data by the demodulation.

As described above, the read system unit 25 of the magneto-optical disc according to the embodiment of the present invention outputs as the final detection result X the candidate data having normal result of the parity check among the main candidate data X1 obtained in accordance with the Viterbi decoding algorithm and the sub candidate data X2$i$ obtained based on the selection path in which a path having lower reliability is reversed from the selection paths obtained in accordance with the Viterbi decoding algorithm. Therefore, it is possible to improve data detection ability and a noise resistance characteristic.

Moreover, in the read system unit 25, the basic information (the selection path Dm, the reverse candidate data Rm, the front edge candidate data X1L, and back edge candidate data X 1T) for generating the main candidate data X1 and sub candidate data X2$i$ is generated by each of the front edge system and the back edge system. And the processing circuit 15 shared between the front edge system and the back edge system generates the main candidate data X1 and the sub candidate data X2$i$ in which the basic information is used, and determines the final detection result X resulting from each candidate data by the parity check. Therefore, compared to a configuration in which the final detection results are obtained from the front edge system and the back edge system, respectively and then the final detection results are synthesized, it is possible to simplify the configuration of the read system unit 25.

In the embodiment of the present invention, the i-th sub candidate data X2$i$ is generated from the selection path obtained by changing every one path to be a reverse candidate (Rm=1: a path having lower reliability) among the selection paths Dm. Alternatively, the sub candidate data may generate from the selection path obtained by reversing every two or three paths or all paths to be the reverse candidates so as to change a plurality of paths to be the reverse candidates.

Figure 11:
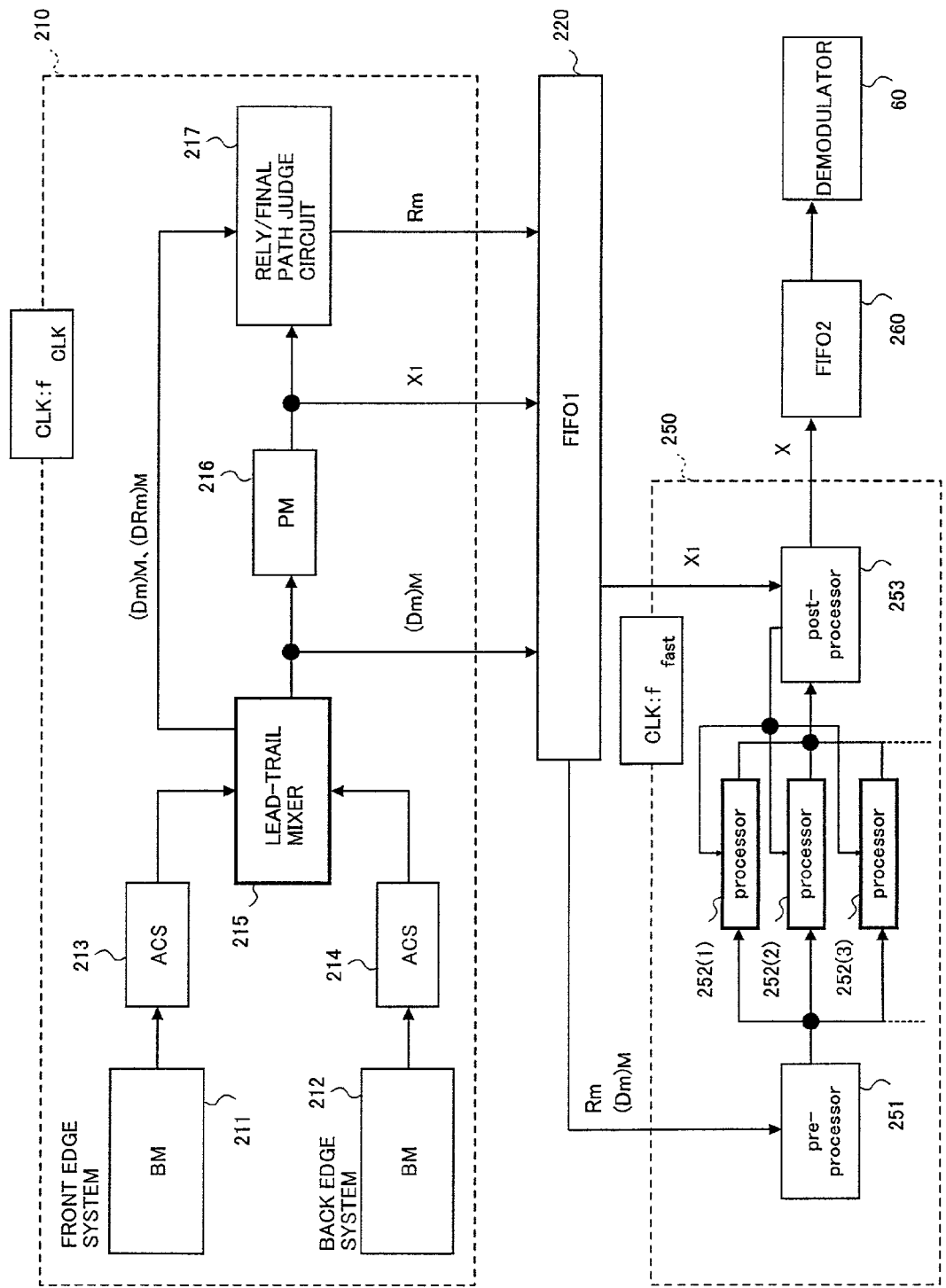
FIG. 11 is a diagram showing a second configuration example of the read system unit.

Next, an example of another configuration of the read system unit 25 will be described. For example, the read system unit 25 can be configured as shown in FIG. 11. In the example, the configuration of the read system unit 25 can be further simplified.

In FIG. 11, read-system unit 25 includes a basic information generation circuit 210, a FIFO memory 220, a processing circuit 250, a FIFO2 memory 260, and the demodulator 60. The basic information generating circuit 210 includes a BM (branch metric calculating unit) 211 and an ACS (addition/comparison/selection unit) 213, as the front edge system, and also includes a BM (branch metric calculating unit) 212 and an ACS (addition/comparison/selection unit) 214 as the back edge system. Moreover, the basic information generation circuit 210 includes a lead-trail mixer (lead-trail mixing circuit) 215, a PM (path memory) 216, and a rely/final selection path judging circuit 217. Similar to the configuration described above, a sampling value sampled from the reproduction signal synchronizing with the front edge clock is supplied to the BM 211 through an equalizer (not shown), and also a sampling value sampled from the reproduction signal synchronizing with the back edge clock is supplied to the BM 212 through the equalizer.

Similar to the example (the BM 111 and the ACS 112) described above, the selection path (Dm) L and the reliability (DRm) L of the front edge system are generated by the BM 211 and the ACS 213 of the front edge system. Also, similar to the example (the BM 131 and the ACS 132) described above, the selection path (Dm) L and the reliability (DRm) L of the back edge system are generated by the BM 212 and the ACS 214 of the back edge system. For example, in the PR(11) of the constraint length 3, the selection path (Dm) L of the front edge system as shown by the arrows of FIG. 9A are obtained and also the selection path (Dm) T of the back edge system as shown by the arrows of FIG. 9B.

Figure 12:
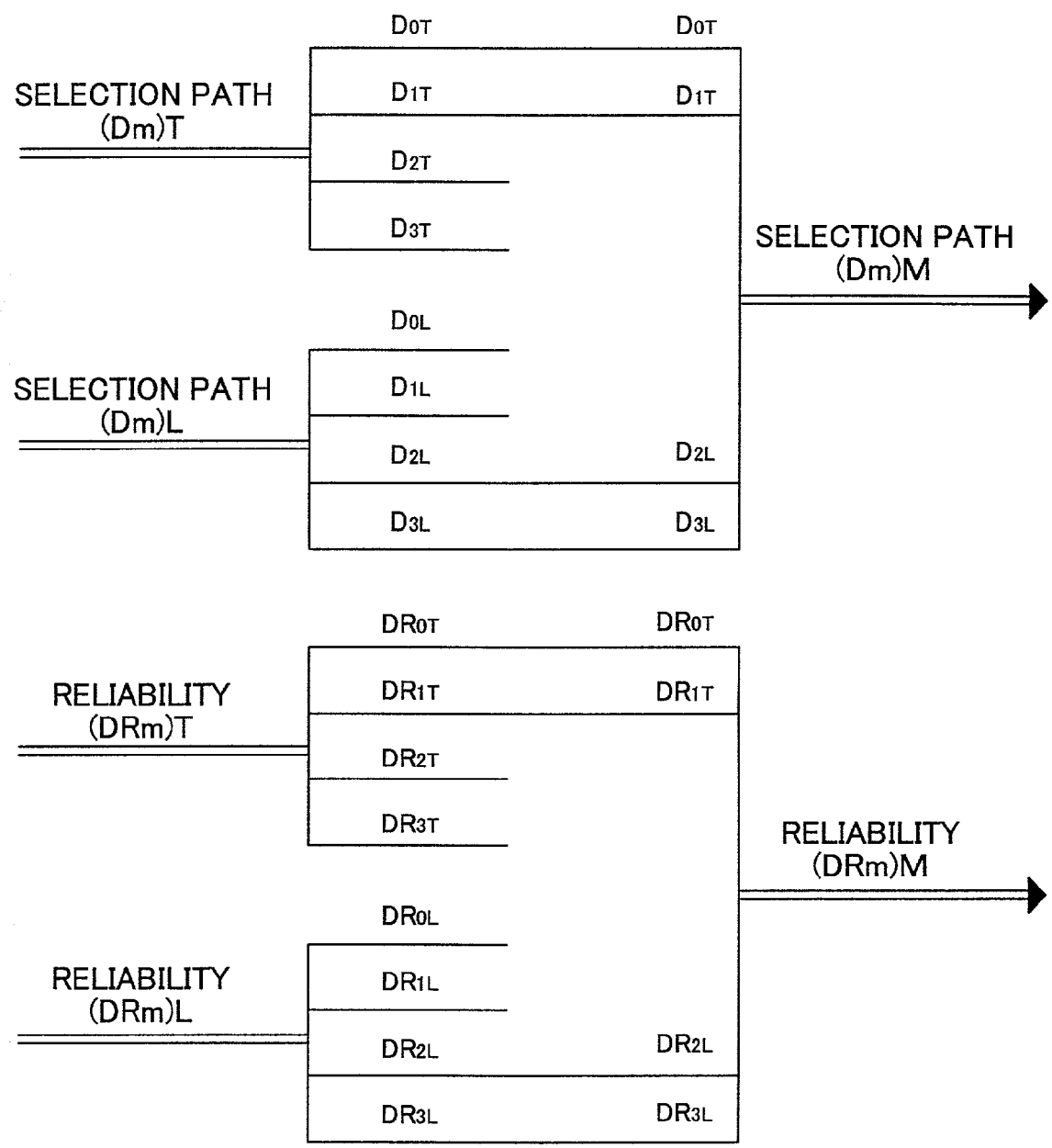
FIG. 12 is a diagram showing a configuration example of a front-back edge mixer in the read system unit shown in FIG. 11.

In a case of PR(11) of the constraint length 3, as described above, the selection path D3 resulting in the state S3 and the selection path D2 resulting in the state S2, and the reliabilities DR2 and DR3 obtained with respect to the selection paths D3 and D2 correspond to the front edge. Also, the selection path D1 resulting in the state S1 and the selection path D0 resulting in the state S0, and the reliabilities DR1 and DR0 obtained with respect to the selection paths D1 and D0 correspond to the back edge. Accordingly, for example, the lead-trail mixer 215 is configured as shown in FIG. 12.

That is, the lead-trail mixer 215 outputs a group (D0T, D1T, D2L, and D2L) of the selection paths as a mixed selection path (Dm) M, and the group of the selection paths includes selection path D2L and D3L among selection paths D0L through D4L output from the ACS 213 of the front edge system and selection paths D0T and D1T among selection paths D0T through D4T output from the ACS 214 of the back edge system. The mixed selection path (Dm) M shows the path indicated by the arrows of FIG. 9C. Also, the lead-trail mixer 215 outputs a group (DR0T, DR1T, DR2L, and DR3L) of reliabilities as the mixed reliability (DRm) M, and the group of the reliabilities includes reliabilities DR2L and DR3L among reliabilities DR0L through DR4L output from the ACS 213 of the front edge system and reliabilities DR0T and DR1T among reliabilities DR0T through DR4T output from the ACS 214 of the back edge system.

The PM 216 and the rely/final selection path 217 conduct a process in accordance with a technique similar to the PMs 113 and 133, and the rely/final path judging circuits 114 and 134 in the example described above (refer to FIG. 6). As a result, the PM 216 to which the mixed selection path (Dm) M is supplied from the lead-trail mixer 215 generates the main candidate data X1 by processing the mixed selection path (Dm) M. Also, the rely/final path judging circuit 217 to which the mixed selection path (Dm) M and the reliability (DRm) M corresponding to the mixed selection path (Dm) M are supplied from the lead-trail mixer 215 generates the reverse candidate data Rm by processing the mixed selection path (Dm) M and the relative reliability (DRm) M.

The mixed selection path (Dm) M generated as the basic information by the basic information generating circuit 210, the main candidate data X1, and the reverse candidate (Rm=1) are temporarily stored in the FIFO memory 220 as described above, and then are supplied to the processing circuit 250.

The processing circuit 250 is configured similar to the processing circuit 150 in the example described above (refer to FIG. 6). The processing circuit 250 includes a pre-processor 251, a plurality of processors 252(1), 252(2), 252(3), . . . , a post-processor 253.

Similar to the pre-processor 152 described above, the pre-processor 251 distributes a group of reverse candidates (Rm=1) and mixed selection paths (Dm) to each of processors 252($i$) ($i$=1 through K). Also, similar to each of the processors 153($i$), each of processors 252($i$) reverses the selection path corresponding to the reverse candidate (Rm=1) among the mixed selection path (Dm) M. And each of processors 252($i$) sequentially generates the i-th sub candidate data X2$i$ from the mixed selection paths (Dm) changed by reversing the selection path.

Similar to the post-processor 154 in the example described above, the back processor 253 conducts the parity check for the sub candidate data X2$i$ from the main candidate data X1 and each of the processors 252($i$) supplied from the FIFO memory 220. The main candidate data X1 outputs either of the main candidate data X1 and each of the sub candidate data X2$i$ whose parity check result is normal, as the parity check result.

In the read system unit 25 having such the configuration as described above, the selection paths (Dm)L and (Dm)T, and the reliabilities (DRm)L and (DRm)M are created in the front edge system and the back edge system individually, in order to generate the basic information (the mixed selection path (Dm)M, the main candidate data X1, and the reverse candidate data (Rm)). However, the basic information is generated by a component part (the lead-trail mixer 215, the PM 216, and the rely/final selection path judging circuit 217) shared by the front edge system and the back edge system in the basic information generation circuit 210. Moreover, the processing circuit 250 by the front edge system and the back edge system creates the main candidate data X1 and the sub candidate data X2$i$ by using the basic information generated as described above, and also determines the final detection result X from each of the main candidate data X1 and the sub candidate data X2$i$ by the parity check. Therefore, the configuration of the read system unit 25 can be further simplified.

In addition, according to the embodiment, even if data are obtained without a modulation process based on the run length limitation in the write system, the original data can be reproduced in any of the configurations described above. In this case, the parity bits are additionally provided to data to be written on the magneto-optical disc 10 in FIG. 2 in accordance with a rule different from such a rule described above (refer to FIG. 4). Moreover, by a technique of parity check as a judging technique of justification of the candidate data, for example, by using a technique of an ECC (Error Correcting Code), the justification of the candidate data can be judged.

Moreover, in the embodiment, in the write system unit 26 configured as described above, even if the read system unit 25 configured as described above is not applied, it is possible to reproduce the original data from the magneto-optical disc 10 in which the parity bits are additionally provided to the original data, and the original data are written on the magneto-optical disc 10. For example, even if a read system unit is provided with a demodulator processing in accordance with a demodulation rule corresponding to the conventional Viterbi detector (refer to FIG. 1) and the run length limitation, it is possible to reproduce data.

In the embodiment, the present invention applied to the magneto-optical disc apparatus is illustrated. Alternatively, technologies described above according to the present invention can be applied to other data reproducing apparatuses, data recording apparatuses, and data recording/reproducing apparatus such an optical disc apparatus, a magnetic disc apparatus.

Moreover, a data recording apparatus provided with functions of the write system unit 26 described above and a data reproducing apparatus provided with functions of the read system unit 25 can be realized.

In the embodiment, the seri-para converter 441, the two exclusive logical sum circuits 442 and 444, two shift registers 443 and 445, the memory unit 446, and the parity table 447 shown in FIG. 5 correspond to a parity bit determining part. And the parity table 447 shown in FIG. 5 corresponds to a parity bit adding part.

The counter 61 and the parity deleting circuit 62 shown in FIG. 10 correspond to a parity deleting part, and the demodulating circuit 63 shown in FIG. 10 corresponds to a data demodulation part.

The basic information generating circuit 110 and the FIFO memory 120 shown in FIG. 6 correspond to the front edge system, the basic information 130 and the FIFO memory 140 shown in FIG. 6 correspond to a back edge system, and the processing circuit 150 shown in FIG. 6 correspond to a processing system.

The BM 211 and the ACS 213 shown in FIG. 11 correspond to the front edge system, the BM 212 and the ACS 214 shown in FIG. 11 correspond to the back edge system, the lead-trail mixer 215, the path memory 216, the rely/final selection path judging circuit 217, the FIFO memory 220, and the processing circuit 250 shown in FIG. 11 correspond to a processing system.

As describe above, according to the present invention, a plurality of parity bits are additionally provided to a current predetermined length block so as to satisfy a predetermined run length limitation rule in a range including the plurality of the parity bits, a current predetermined length block and a next predetermined length block positioned before or after the plurality of the parity bits. Therefore, it is possible to realize a data recording apparatus for recording data so that both the run length limitation and the parity bits are available when data are reproduced.

Moreover, according to the present invention, it is possible to properly reproduce data from the recording medium in which the data are recorded by the data recording apparatus.

Furthermore, according to the present invention, data are reproduced by considering selection paths selected in accordance with a predetermined rule and change paths selected based on the differences among the path metric values indicating a reliability rate of the selection paths. In addition, configurations duplicated for and provided to both the front edge system and the back edge system can be simplified. Therefore, it is possible to realize a simplified data reproducing apparatus.

Moreover, according to the present invention, it is possible to realize the data recording/reproducing apparatus providing each function of the data recording apparatus and the data reproducing apparatus as described above.

The present invention is not limited to the specifically disclosed embodiments, variations and modifications, and other variations and modifications may be made without departing from the scope of the present invention.

The present application is based on Japanese Priority Application No.2001-317039 filed on Oct. 15, 2001, the entire contents of which are hereby incorporated by reference.

What is claimed is:

1. A data reproducing apparatus for demodulating data from a reproduction signal in accordance with a partial response waveform obtained from a recording medium, by a Viterbi decoding technique based on front edge sampling values obtained by sampling while synchronizing a front edge clock synchronizing a leading edge of said reproduction signal and back edge sampling values obtained by sampling while synchronizing a back edge clock synchronizing a trailing edge of said reproduction signal, comprising:

a front edge system processing said front edge sampling values;

a back edge system processing said back edge sampling values; and a processing system modulating data based on information obtained individually from said front edge system and said back edge system, wherein:

said front edge system comprises:

a first selection path selecting part selecting one path as a first selection path so as to correspond to a state transition of data according to a predetermined rule that is based on results from calculating a branch metric value using each expected value defined by said partial response waveform and each of said front edge sampling values, calculating a path metric value based on every said branch metric value, and comparing among a plurality of said path metric values;

a first generating part generating front edge candidate data corresponding to said first selection path selected by said first selection path selecting part; and a first change path selecting part selecting one path different from said first selection path as a first change path based on differences among the plurality of said path metric values to be compared by said first selection path selecting part, said back edge system comprises:

a second selection path selecting part selecting one path as a second selection path so as to correspond to the state transition of data according to the predetermined rule that is based on results from calculating a branch metric value using each expected value defined by said partial response waveform and each of said back edge sampling values, calculating a path metric value based on every said branch metric value, and comparing among a plurality of said branch metric values;

a second generating selecting part generating back edge candidate data corresponding to said second selection path selected by said second selection path selecting part; and a second change path selecting part selecting one path different from said second selection path as a second change path based on differences among the plurality of said path metric values to be compared by said second selection path selecting part, said processing system comprises:

a first candidate data generating part generating first candidate data by synthesizing said front edge candidate data from said front edge system with said back edge candidate data from said back edge system, a mixed selection path generating part generating a mixed selection path based on said first selection path from said front edge system and said second selection path from said back edge system;

a second candidate data generating part changing paths that are of said mixed selection path and correspond to said first change path from said front edge system and said second change path from said back edge system, to said change paths as change selection paths, and generating second candidate data in accordance with said Viterbi decoding technique based on said change selection paths; and a data selecting part selecting either of said first candidate data and said second candidate data based on a predetermined reference concerning likelihood, wherein data to be reproduced are reproduced based on either of said first candidate data and said second candidate data selected by said data selecting part.

2. A data reproducing apparatus as claimed in claim 1, further comprising:

a parity bit determining part determining values of parity bits to be additionally provided every one predetermined length block in data obtained by modulating said original data, so as to satisfy a part of or an entire said predetermined run length limitation rule in ranges of a current predetermined length block in which said plurality of parity bits are additionally provided, said plurality of parity bits, and a next predetermined length block that is positioned next to said current block; and a parity adding part adding said parity bits having said values determined by said parity bit determining part to said current block, wherein data, in which said parity bits are provided every one predetermined length block, are written in said recording medium.

3. The data reproducing apparatus as claimed in claim 1, wherein said parity bit determining part determines said values of said parity bits so as to satisfy a predetermined run length limitation in a first range including both a predetermined last range of said current predetermined length block defined based on said predetermined run length limitation rule and a range of a plurality of parity bits following said predetermined last range, and further satisfy a part of or an entire said predetermined run length limitation in a second range including said first range and a predetermined first range defined based on said predetermined run length limitation rule.

4. The data reproducing apparatus as claimed in claim 1, further comprising:

a sampling part obtaining a sampling value at a predetermined period from said reproduction signal;

a data detecting part detecting a data bit sequence in accordance with a predetermined algorithm from the sampling value obtained by said sampling part;

a parity check part conducting a parity check for every predetermined length block in the data bit sequence detected by said data detecting part;

a parity deleting part deleting the parity bits added in accordance with a predetermined rule from each of the predetermined length blocks that is justified by said parity check part; and a data demodulating part demodulating a remaining bit sequence, in which said parity bits are deleted from each of said predetermined length blocks by said parity deleting part, in accordance with a demodulation rule corresponding to said predetermined run length limitation rule, so as to demodulate data.

5. The data reproducing apparatus as claimed in claim 1, wherein said data selecting part selects either of said first candidate data and said second candidate data by using a reference that is based on a predetermined error detecting technique as said predetermined reference concerning said likelihood.

6. The data reproducing apparatus as claimed in claim 5, wherein said data selecting part uses a technique of a parity check as said predetermined error detecting technique.

7. The data reproducing apparatus as claimed in claim 5, wherein when error detection is conducted for both said first candidate data and said second candidate data, said data selecting part selects said first candidate data.

8. The data reproducing apparatus as claimed in claim 1, wherein when a plurality of said first change paths and a plurality of said second change paths are supplied from said front edge system and back edge system, respectively, said second candidate data generating part generates a plurality of said change selection paths by using every one or a given number of said plurality of said first change paths and said plurality of said second change paths, and generates a plurality of said second candidate data corresponding to said plurality of said change selection paths; and said data selecting part selects data from said first candidate data and said plurality of said second candidate data.

9. A data recording/reproducing apparatus comprising:

a write unit for writing data obtained by modulating original data in accordance with a predetermined run length limitation to a recording medium; and a read unit for reproducing data from a reproduction signal in accordance with a partial response waveform obtained from the recording medium by a Viterbi decoding technique based on front edge sampling values obtained by sampling while synchronizing a front edge clock synchronizing a leading edge of the reproduction signal and back edge sampling values obtained by sampling while synchronizing a back edge clock synchronizing a trailing edge of the reproduction signal, wherein:

said write unit comprises:

a parity bit determining part determining values of parity bits to be additionally provided every one predetermined length block in data obtained by modulating said original data, so as to satisfy a part of or an entire said predetermined run length limitation rule in ranges of a current predetermined length block in which said plurality of parity bits are additionally provided, said plurality of parity bits, and a next predetermined length block that is positioned next to said current predetermined length block; and a parity adding part adding said parity bits having said values determined by said parity bit determining part to said current predetermined length block, wherein data, in which said parity bits are provided every one predetermined length block, are written in said recording medium, said read unit comprises:

a front edge system processing said front edge sampling values;

a back edge system processing said back edge sampling values; and a processing system modulating data based on information obtained individually from said front edge system and said back edge system, wherein:

said front edge system comprises:

a first selection path selecting part selecting one path as a first selection path so as to correspond to a state transition of data according to a predetermined rule that is based on results from calculating a branch metric value using each expected value defined by said partial response waveform and each of said front edge sampling values, calculating a path metric value based on every said branch metric value, and comparing among a plurality of said path metric values;

a first generating part generating front edge candidate data corresponding to said first selection path selected by said first selection path selecting part; and a first change path selecting part selecting one path different from said first selection path as a first change path based on differences among the plurality of said path metric values to be compared by said first selection path selecting part, said back edge system comprises:

a second selection path selecting part selecting one path as a second selection path so as to correspond to the state transition of data according to the predetermined rule that is based on results from calculating a branch metric value using each expected value defined by said partial response waveform and each of said back edge sampling values, calculating a path metric value based on every said branch metric value, and comparing among a plurality of said branch metric values;

a second generating selecting part generating back edge candidate data corresponding to said second selection path selected by said second selection path selecting part; and a second change path selecting part selecting one path different from said second selection path as a second change path based on differences among the plurality of said path metric values to be compared by said second selection path selecting part, and said processing system comprises:

a first candidate data generating part generating first candidate data by synthesizing said front edge candidate data from said front edge system with said back edge candidate data from said back edge system;

a mixed selection path generating part generating a mixed selection path based on said first selection path from said front edge system and said second selection path from said back edge system;

a second candidate data generating part changing paths that are of said mixed selection path and correspond to said first change path from said front edge system and said second change path from said back edge system, to said change paths as change selection paths, and generating second candidate data in accordance with said Viterbi decoding technique based on said change selection paths;

a data selecting part selecting either of said first candidate data and said second candidate data based on error detection result in accordance with an addition rule of said parity bits with respect to said first candidate data and said second candidate data;

a parity deleting part deleting parity bits additionally provided in accordance with said predetermined addition rule from said first candidate data and said second candidate data that are selected by said data selecting part; and a data demodulating part demodulating remaining data parts in which said parity bits are deleted from said first candidate data and said second candidate data that are selected by said data selecting part.

* * * * *

UNITED STATES PATENT AND TRADEMARK OFFICE
CERTIFICATE OF CORRECTION

PATENT NO. : 6,982,942 B2
DATED : January 3, 2006
INVENTOR(S) : Uchida et al.

It is certified that error appears in the above-identified patent and that said Letters Patent is hereby corrected as shown below:

Column 25,
Line 48, delete "claim 1" and insert -- claim 2 --.

Signed and Sealed this

Eleventh Day of April, 2006

JON W. DUDAS
*Director of the United States Patent and Trademark Office*